US010132877B2

(12) United States Patent
Su et al.

(10) Patent No.: US 10,132,877 B2
(45) Date of Patent: Nov. 20, 2018

(54) MICRO-ELECTROMECHANICAL APPARATUS WITH PIVOT ELEMENT

(71) Applicant: Industrial Technology Research Institute, Hsinchu (TW)

(72) Inventors: Chung-Yuan Su, Taichung (TW); Chao-Ta Huang, Hsinchu (TW); Sheng-Ren Chiu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 673 days.

(21) Appl. No.: 14/576,203

(22) Filed: Dec. 19, 2014

(65) Prior Publication Data

US 2015/0308830 A1    Oct. 29, 2015

(30) Foreign Application Priority Data

Apr. 29, 2014    (TW) .............................. 103115343 A

(51) Int. Cl.
   *G01C 19/5712*    (2012.01)
   *G01R 33/02*    (2006.01)

(52) U.S. Cl.
   CPC .......... *G01R 33/02* (2013.01); *G01C 19/5712* (2013.01)

(58) Field of Classification Search
   CPC ..... G01C 21/10; G01C 19/5712; G01R 33/02
   USPC ........................................................... 73/495
   See application file for complete search history.

(56) References Cited

U.S. PATENT DOCUMENTS

| 5,203,208 | A  | * | 4/1993 | Bernstein ........... G01C 19/5719 73/504.12 |
| 6,062,082 | A  |   | 5/2000 | Guenther et al. |
| 6,443,008 | B1 |   | 9/2002 | Funk et al. |
| 6,837,107 | B2 |   | 1/2005 | Geen |
| 6,848,304 | B2 |   | 2/2005 | Geen |

(Continued)

FOREIGN PATENT DOCUMENTS

| CN | 101910789 | 12/2010 |
| CN | 102334010 | 1/2012 |

(Continued)

OTHER PUBLICATIONS

Tsai et al., "Design and Analysis of a Tri-Axis Gyroscope Micromachined by Surface Fabrication," IEEE Sensors Journal, Dec. 2008, pp. 1933-1940.

(Continued)

*Primary Examiner* — J M Saint Surin
(74) *Attorney, Agent, or Firm* — JCIPRNET

(57) ABSTRACT

A micro-electromechanical apparatus may include a substrate, a first frame, a plurality of first anchors, a region and a plurality of pivot elements. The plurality of first anchors and the region is disposed on the substrate. The region is surrounded by the plurality of first anchors. Each of the pivot elements includes a pivot end and a rotary end. Each of the pivot ends is connected to a corresponding first anchor and each of the rotary ends is connected to the first frame such that the first frame is able to rotate with respect to an axis passing the region. The micro-electromechanical apparatus having the pivot elements and the region is adapted for detecting multi-degree physical quantities such as angular velocities in at least two axes, angular velocities and accelerations, angular velocities and Earth's magnetic field.

40 Claims, 20 Drawing Sheets

(56) References Cited

U.S. PATENT DOCUMENTS

| | | | |
|---|---|---|---|
| 7,168,317 B2* | 1/2007 | Chen | G01C 19/5719 73/504.04 |
| 7,694,563 B2 | 4/2010 | Durante et al. | |
| 7,934,423 B2 | 5/2011 | Nasiri et al. | |
| 8,272,267 B2* | 9/2012 | Tamura | G01C 19/5712 73/504.12 |
| 8,413,506 B2 | 4/2013 | Coronato et al. | |
| 8,448,513 B2 | 5/2013 | Lin | |
| 9,010,184 B2* | 4/2015 | Zou | G01P 15/125 73/504.12 |
| 9,051,170 B2* | 6/2015 | Huang | G01R 33/0286 |
| 9,097,524 B2* | 8/2015 | Seeger | G01C 19/5733 |
| RE45,792 E * | 11/2015 | Coronato | G01C 19/5712 |
| 9,194,704 B2* | 11/2015 | Lin | G01C 19/5747 |
| 9,250,143 B2* | 2/2016 | Harrington | G01L 1/142 |
| 9,278,847 B2* | 3/2016 | Cazzaniga | G01C 19/5712 |
| 9,404,747 B2* | 8/2016 | Valzasina | G01C 19/5747 |
| 9,745,189 B1* | 8/2017 | Geisberger | B81C 1/00626 |
| 9,841,281 B2* | 12/2017 | Su | B81B 3/0045 |
| 2006/0112764 A1* | 6/2006 | Higuchi | G01C 19/5719 73/504.12 |
| 2006/0156812 A1* | 7/2006 | Kai-Cheng | G01C 19/5719 73/504.12 |
| 2008/0096301 A1* | 4/2008 | Ramamoorthi | B81C 3/004 438/50 |
| 2008/0276706 A1* | 11/2008 | Hartmann | G01C 19/5747 73/504.04 |
| 2009/0007661 A1* | 1/2009 | Nasiri | G01P 1/023 73/504.03 |
| 2010/0101323 A1* | 4/2010 | Kohn | G01C 19/5712 73/504.12 |
| 2010/0126269 A1* | 5/2010 | Coronato | G01C 19/5712 73/504.04 |
| 2010/0126272 A1* | 5/2010 | Coronato | G01C 19/5712 73/504.14 |
| 2010/0132460 A1 | 6/2010 | Seeger et al. | |
| 2010/0236327 A1* | 9/2010 | Mao | G01C 19/5719 73/504.12 |
| 2010/0257934 A1* | 10/2010 | Zhang | G01C 19/5719 73/504.12 |
| 2010/0263446 A1* | 10/2010 | Tamura | G01C 19/5712 73/504.12 |
| 2011/0030473 A1* | 2/2011 | Acar | G01C 19/5712 73/504.12 |
| 2011/0061460 A1* | 3/2011 | Seeger | G01C 19/5719 73/504.12 |
| 2011/0154898 A1* | 6/2011 | Cazzaniga | G01C 19/5747 73/504.12 |
| 2011/0197677 A1 | 8/2011 | Nasiri et al. | |
| 2011/0303010 A1* | 12/2011 | Yang | G01P 15/125 73/514.32 |
| 2013/0239679 A1* | 9/2013 | Kornilovich | G01C 19/5712 73/504.12 |
| 2014/0266170 A1* | 9/2014 | Seeger | G01P 15/08 324/227 |
| 2016/0130133 A1* | 5/2016 | Boillot | B81B 3/0048 73/504.12 |

FOREIGN PATENT DOCUMENTS

| | | |
|---|---|---|
| CN | 202109911 | 1/2012 |
| CN | 102530825 | 7/2012 |
| CN | 102826499 | * 12/2012 |
| CN | 103185574 | 7/2013 |
| JP | 2013096801 | 5/2013 |
| TW | 200811419 | 3/2008 |
| TW | 200821543 | 5/2008 |

OTHER PUBLICATIONS

Jeong et al., "Three-axis MEMS inertial sensor for automobile applications," IEEE Sensors, Oct. 28-31, 2011, pp. 444-447.

Murakoshi et al., "Electrostatically Levitated Ring-Shaped Rotational-Gyro/Accelerometer," Japanese Journal of Applied Physics, Apr. 2003, pp. 2468-2472.

Benedetto Vigna, "Tri-axial MEMS gyroscopes and Six Degree-Of-Freedom Motion Sensors," IEEE International Electron Devices Meeting (IEDM), Dec. 5-7, 2011, pp. 29.1.1-29.1.3.

Ahmed et al., "A 3-axis PZT-based MEMS gyroscope in 0.18μm CMOS," Proceedings of the ESSCIRC (ESSCIRC), Sep. 17-21, 2012, pp. 241-244.

"Office Action of China Counterpart Application," dated Jul. 20, 2017, p. 1-p. 12.

* cited by examiner

MICRO-ELECTROMECHANICAL APPARATUS WITH PIVOT ELEMENT

CROSS-REFERENCE TO RELATED APPLICATION

This application claims the priority benefit of Taiwan application serial no. 103115343, filed on Apr. 29, 2014. The entirety of the above-mentioned patent application is hereby incorporated by reference herein and made a part of this specification.

TECHNICAL FIELD

The disclosure is related to a micro-electromechanical apparatus, and a micro-electromechanical apparatus having pivot elements.

BACKGROUND

In recent years, driven by the demand of vehicle indoor navigation and personal mobile navigation, an inertial measurement unit (IMU) has gradually become an auxiliary system for navigation apparatuses. For instance, when a vehicle enters a tunnel or an underground parking lot, or when a pedestrian walks into a building, the global positioning system (GPS) in the navigation apparatus may be affected by a shielding effect such that the navigation apparatus may temporarily not be able to receive a position signal from a satellite.

In the above situations, the navigation apparatus cannot obtain sufficient signals from the satellite, and therefore cannot find the accurate position of a user. As a result, accurate navigation information cannot be provided. On the other hand, if the measurement data of the IMU is provided, the navigation apparatus can continue to provide position information and navigation information in places where a GPS signal cannot be received. Therefore, a navigation apparatus integrating the IMU and the GPS has become the next major competitive product in the market.

Regarding current techniques, the traditional micro-electromechanical IMU mainly contains a three-axis accelerometer and a three-axis gyroscope. The three-axis gyroscope includes an oscillator and three Coriolis accelerometers. The oscillator needs to be able to oscillate in two perpendicular directions on the same plane at the same time. To prevent the sensing signals of the three-axis accelerometer and the three-axis gyroscope from interfering with each other, the IMU adopts a design in which three masses of the accelerometer and three masses of the gyroscope are capable of moving independently. However, the design has the disadvantage of having excessive overall area of the IMU because no common mass is used in the design.

In the known techniques, a hollow disc-like oscillator of the gyroscope can be rotated to generate an oscillation in two perpendicular directions on the same plane at the same time. Since the hollow disc-like oscillator generally rotates by taking an element located on the axis of rotation as a pivot, an additional sensor such as accelerometer cannot be disposed in the central region of the disc-like oscillator.

FIG. 1A is a schematic diagram of a simplified X-axis accelerometer. Referring to FIG. 1A, when an accelerometer 10 senses an acceleration $A_x$ in the direction parallel to the X-axis, the distance between a fixed electrode 14 and a moving electrode 15 is changed, causing a change in capacitance. Therefore, the value of the acceleration $A_x$ can be calculated by sensing the change of capacitance between the fixed electrode 14 and the moving electrode 15.

FIG. 1B is a schematic diagram of a simplified Y-axis accelerometer. Referring to FIG. 1B. When an accelerometer 20 senses an acceleration $A_y$ in the direction parallel to the Y-axis, the capacitance between a fixed electrode 24 and a moving electrode 25 is changed. Therefore, the value of the acceleration $A_y$ can be calculated by sensing the change of capacitance between a fixed electrode 24 and a moving electrode 25.

FIG. 1C is a schematic diagram of a simplified Z-axis accelerometer. Referring to FIG. 1C, when an accelerometer 30 senses an acceleration $A_z$ in the direction parallel to the Z-axis, a mass 33 connected to a fixed end 32 via a torsion beam 31 rotates about the torsion beam 31 (i.e., the axis of rotation is parallel to the Y-axis), similar to the swinging of a seesaw, such that the capacitance between the fixed electrode 34 and the moving electrode 35 is changed. Therefore, the value of the acceleration $A_z$ can be calculated by sensing the change of capacitance between the fixed electrode 34 and the moving electrode 35.

In general, the torsion beam 31 is disposed on two opposite sides of the mass 33, and a connecting line 31a between the two torsion beams 31 does not pass through a center of mass 33a of the mass 33. In other words, the torsion beam 31 is, for instance, eccentrically disposed on the mass 33 to improve the sensitivity of the accelerometer 30. Moreover, in a related art (not shown), the torsion beam can also be connected to the mass and the fixed end along the direction parallel to the X-axis. When the accelerometer occurs in the direction parallel to the Z-axis, the mass rotates about the torsion beams (i.e., the axis of rotation is parallel to the X-axis), similar to the swinging of a seesaw. Under such configuration, the accelerometer can also calculate the value of acceleration in the direction parallel to the Z-axis.

The accelerometers 10, 20, and 30 can respectively be used for measuring acceleration in the directions parallel to the X-axis, the Y-axis, and the Z-axis. Therefore, a three-axis accelerometer can be formed by integrating the accelerometers 10, 20, and 30 into a single apparatus.

FIG. 2A is a schematic diagram of a simplified X-axis gyroscope. Referring to FIG. 2A, a spring 41 is connected to an anchor 42 and a frame 43, and a torsion beam 44 is connected to the frame 43 and a mass 45. The frame 43 oscillates along the direction parallel to the Y-axis so as to drive the mass 45 to oscillate along the direction parallel to the Y-axis. When the gyroscope 40 senses an angular velocity $R_x$ in the direction parallel to the X-axis, the mass 45 rotates about the torsion beam 44 (i.e., the axis of rotation is parallel to the X-axis). Therefore, the capacitance between the mass 45 and electrode (not shown) on the substrate (not shown) is changed. The value of the angular velocity $R_x$ can be calculated by sensing the change of capacitance caused by the rotation of the mass 45.

FIG. 2B is a schematic diagram of a simplified Y-axis gyroscope. Referring to FIG. 2B, a spring 51 is connected to an anchor 52 and a frame 53, and a torsion beam 54 is connected to the frame 53 and a mass 55. The frame 53 oscillates along the direction parallel to the X-axis so as to drive the mass 55 to oscillate along the direction parallel to the X-axis. When the gyroscope 50 senses an angular velocity $R_y$ in the direction parallel to the Y-axis, the mass 55 rotates about the torsion beam 54 (i.e., the axis of rotation is parallel to the Y-axis). Therefore, the capacitance between the mass 55 and electrode (not shown) on the substrate (not shown) is changed. The value of the angular velocity $R_y$ can be calculated by sensing the change of capacitance caused by the rotation of the mass 55.

FIG. 2C is a schematic diagram of a simplified Z-axis gyroscope. Referring to FIG. 2C, a spring 61 is connected to an anchor 62 and a frame 63, and a spring 64 is connected to the frame 63 and a mass 65. The frame 63 oscillates along the direction parallel to the Y-axis so as to drive the mass 65 to oscillate in the direction parallel to the Y-axis. When the gyroscope 50 senses an angular velocity $R_z$ in the direction parallel to the Z-axis, the mass 65 translates in the direction parallel to the X-axis. Therefore, the value of the angular velocity $R_z$ can be calculated by sensing the change of capacitance between the fixed electrode (not shown) on the substrate (not shown) and the moving electrode (not shown) on the mass 65.

FIG. 2D is a schematic diagram of another simplified Z-axis gyroscope. Referring to FIG. 2D, a spring 71 is connected to an anchor 72 and a frame 73, and a spring 74 is connected to the frame 73 and a mass 75. The frame 73 oscillates along the direction parallel to the X-axis so as to drive the mass 75 to oscillate along the direction parallel to the X-axis. When the gyroscope 70 senses the angular velocity $R_z$ in the direction parallel to the Z-axis, the mass 75 translates in the direction parallel to the Y-axis. Therefore, the value of the angular velocity $R_z$ can be calculated by sensing the change of capacitance between the fixed electrode (not shown) on the substrate (not shown) and the moving electrode (not shown) on the mass 75.

The gyroscopes 40, 50, and 60 (or 70) can respectively be used for measuring the angular velocity in the directions parallel to the X-axis, Y-axis, and Z-axis. A three-axis gyroscope can be formed by integrating the gyroscopes 40, 50, and 60 (or 70). A six-axis IMU needs to integrate the three-axis accelerometer and the three-axis gyroscope into a single apparatus.

In the current techniques, the IMU can adopt (1) a design of sharing a common mass (i.e., the accelerometer and the gyroscope use the same proof mass) or (2) a design of applying independent masses (i.e., the accelerometer and the gyroscope use different proof masses). FIG. 3 is a schematic diagram of a known IMU, wherein the accelerometer and the gyroscope adopt the design of sharing a common mass. FIG. 4 is a schematic diagram of a known IMU, wherein the accelerometer and the gyroscope adopt the design of applying independent masses.

Referring to FIG. 3, a common mass 81 of an IMU 80 is surrounded by an electrode 82 for radial control, a rotor 83, and an electrode 84 for radial control, wherein a common electrode 85 is between any two adjacent electrodes 84 for radial control. Since the IMU 80 uses the same mass 81 as a common mass for detecting accelerations in three axes and angular velocities in two axes, the IMU 80 has the disadvantages of coupling noise of sensing signal and complexity of readout circuit design.

Referring to FIG. 4, an IMU 90 is formed by a three-axis gyroscope 91 and a three-axis accelerometer 92, wherein the three-axis gyroscope 91 and the three-axis accelerometer 92 are independent sensing structures which apply independent masses. More specifically, the three-axis gyroscope 91 is formed by three independent angular velocity sensing structures 91a, 91b, and 91c which are respectively used for detecting angular velocities in three axes. Moreover, the three-axis accelerometer 92 is formed by three independent acceleration sensing structures 92a, 92b, and 92c which are respectively used to detect accelerations in three axes. Each of the three angular velocity sensing structures 91a, 91b, and 91c uses an independent oscillating frame respectively, and the three acceleration sensing structures 92a, 92b, and 92c also do not use a common mass. As a result, the IMU 90 has the disadvantages of, for instance, large footprint area and high manufacturing costs.

FIG. 5 is a schematic diagram of a known three-axis gyroscope. Referring to FIG. 5, U.S. Pat. No. 7,694,563 discloses a micro-electromechanical three-axis gyroscope 100. The micro-electromechanical three-axis gyroscope 100 uses a hollow disc-like structure 110 as an oscillator. A pivot element 111 of the oscillator is disposed in the center of the hollow disc-like structure 110. Accordingly, the hollow disc-like structure 110 drives masses 120, 130, and 140 to rotate about the Z-axis to sense angular velocities in three axes.

FIG. 6 is a schematic diagram of a known differential gyroscope. Referring to FIG. 6, US Patent US 20100132460 discloses a differential gyroscope 200. When a mass 230 is driven, the mass 230 moves in the opposite direction to sense an angular velocity.

SUMMARY

The disclosure provides a micro-electromechanical apparatus adapted for detecting angular velocities on at least two axes. The micro-electromechanical apparatus may include a substrate; a plurality of first anchors disposed on the substrate; a plurality of pivot elements, wherein each of the pivot elements includes a pivot end and a rotary end; a region disposed on the substrate and surrounded by the plurality of first anchors; and a first frame configured to rotate with respect to an axis passing through the region. The plurality of first anchors and the plurality of pivot elements are surrounded by the first frame, each of the pivot ends is connected to a corresponding first anchor and each of the rotary ends is connected to the first frame, and a distance between each of the pivot ends and the axis is equal to a constant.

The disclosure further provides a micro-electromechanical apparatus including a substrate, a plurality of first anchors disposed on the substrate, a plurality of pivot elements, a region disposed on the substrate and surrounded by the first anchors, and a first frame configured to rotate with respect to an axis passing through the region. Each of the pivot elements includes a pivot end and a rotary end. The first anchors and the pivot elements are surrounded by the first frame, each of the pivot ends is connected to a corresponding first anchor, and each of the rotary ends is connected to the first frame. A distance between each of the pivot ends and the axis is equal to a constant, and a width of the pivot end is less than a width of the rotary end.

The disclosure further provides a micro-electromechanical apparatus including a substrate, a plurality of first anchors disposed on the substrate, a plurality of pivot elements, a region disposed on the substrate and surrounded by the first anchors, a first frame configured to rotate with respect to an axis passing through the region, a plurality of first supports, and a plurality of second supports. Each of the pivot elements includes a pivot end and a rotary end. The first anchors and the pivot elements are surrounded by the first frame, each of the pivot ends is connected to a corresponding first anchor, and each of the rotary ends is connected to the first frame. A distance between each of the pivot ends and the axis is equal to a constant, and at least one of the first supports and at least one of the corresponding second supports are connected to a corresponding pivot element symmetrically.

The disclosure further provides a micro-electromechanical apparatus including a substrate, a plurality of first anchors disposed on the substrate, a plurality of pivot elements, a region disposed on the substrate and surrounded by the first anchors, a first frame configured to rotate with respect to an axis passing through the region, and a plurality of unbalance masses disposed between the region and the first frame. Each of the pivot elements includes a pivot end and a rotary end. The first anchors and the pivot elements are surrounded by the first frame, each of the pivot ends is connected to a corresponding first anchor, and each of the rotary ends is connected to the first frame. A distance between each of the pivot ends and the axis is equal to a constant, and the unbalance mass has a concave portion facing the axis.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1A:
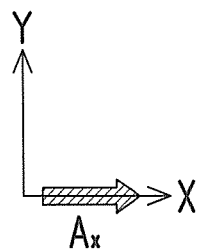
FIG. 1A is a schematic diagram of a known X-axis accelerometer.
Figure 1A:
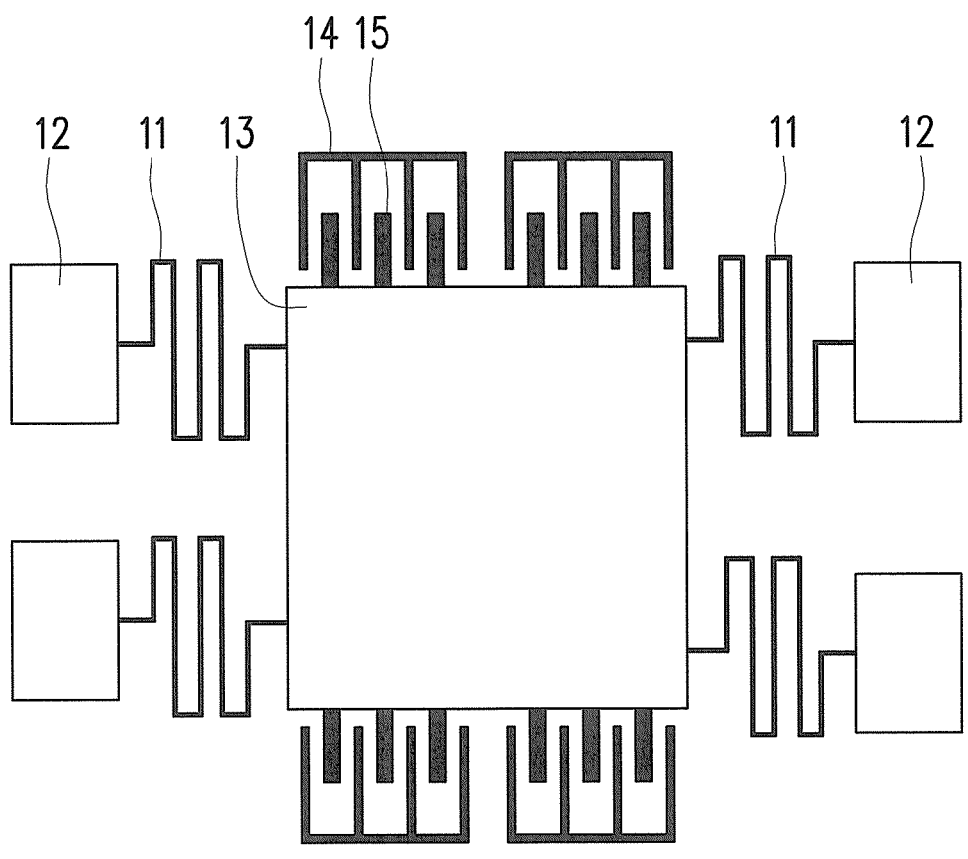
Figure 1B:
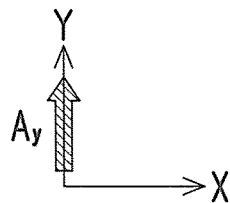
FIG. 1B is a schematic diagram of a known Y-axis accelerometer.
Figure 1B:
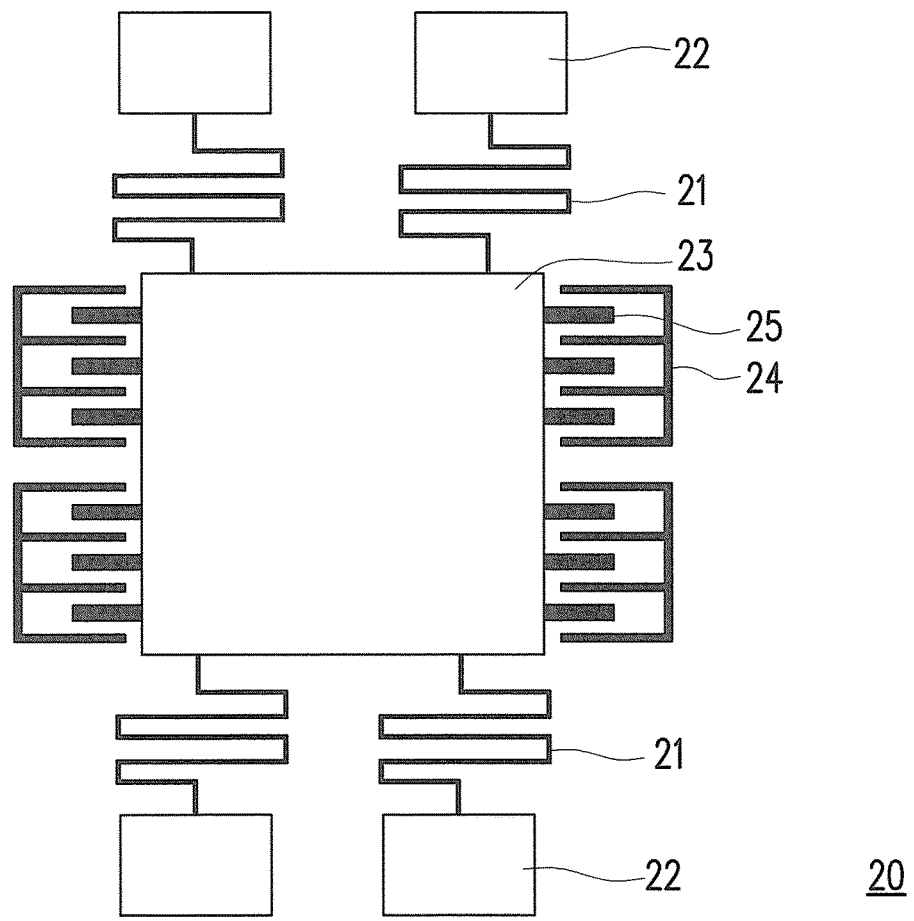
Figure 1C:
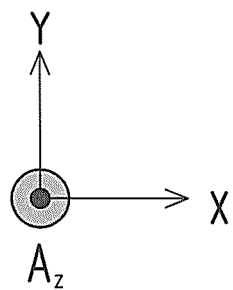
FIG. 1C is a schematic diagram of a known Z-axis accelerometer.
Figure 1C:
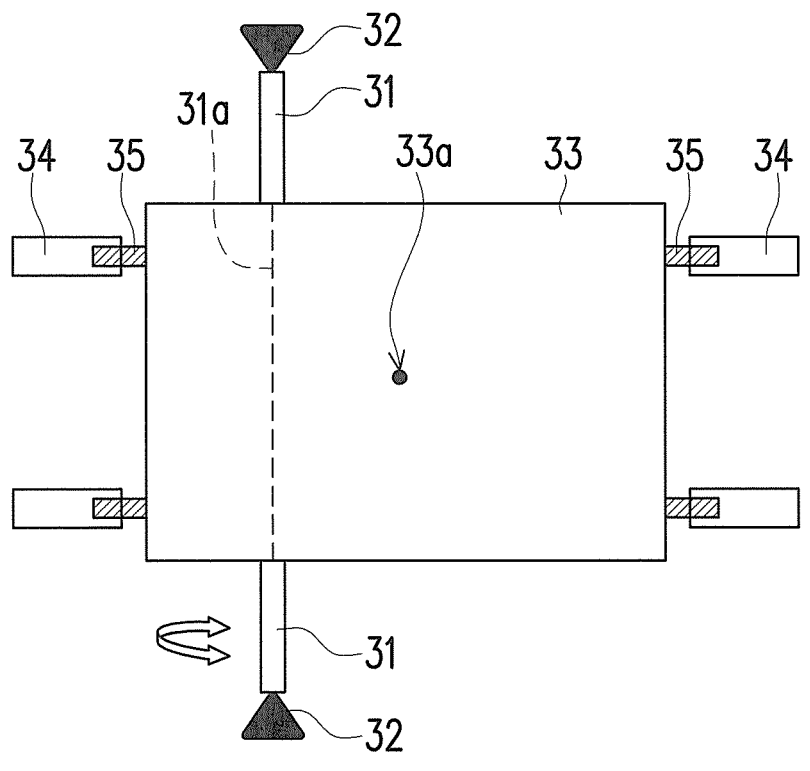
Figure 2A:
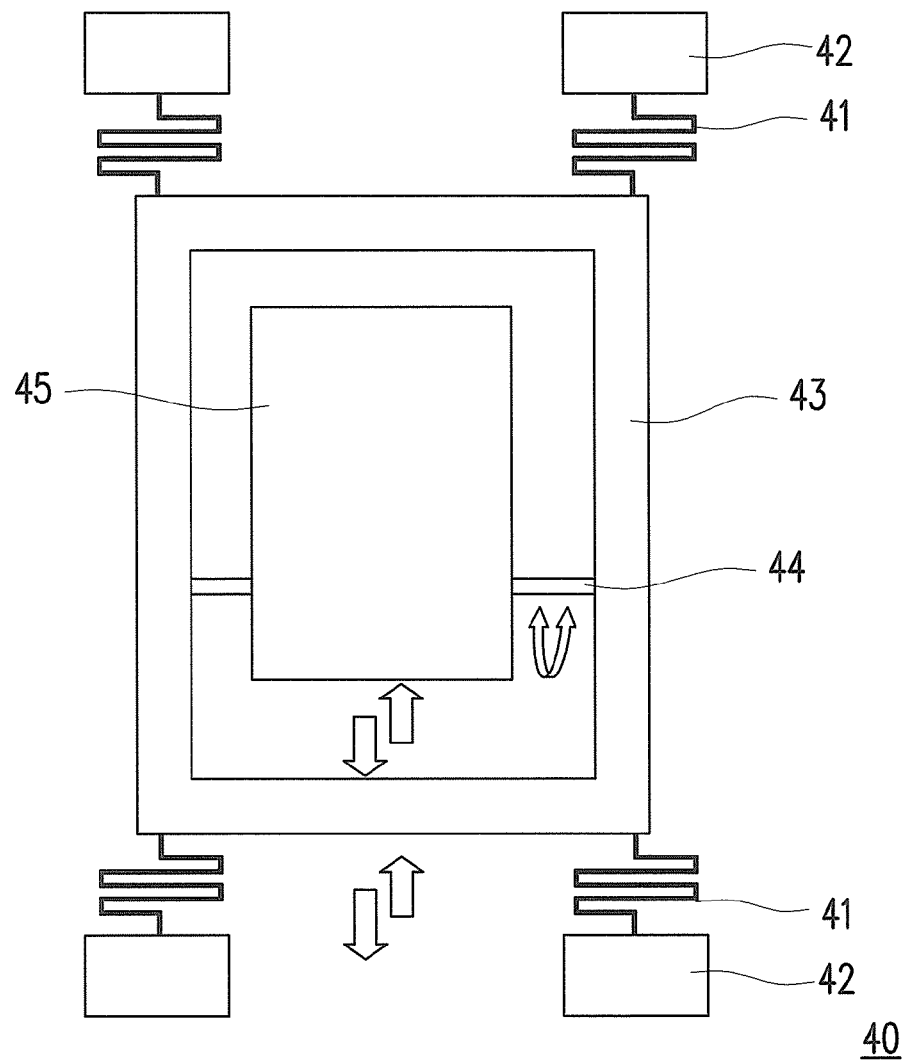
FIG. 2A is a schematic diagram of a known X-axis gyroscope.
Figure 2B:
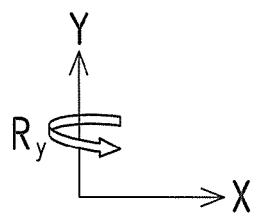
FIG. 2B is a schematic diagram of a known Y-axis gyroscope.
Figure 2B:
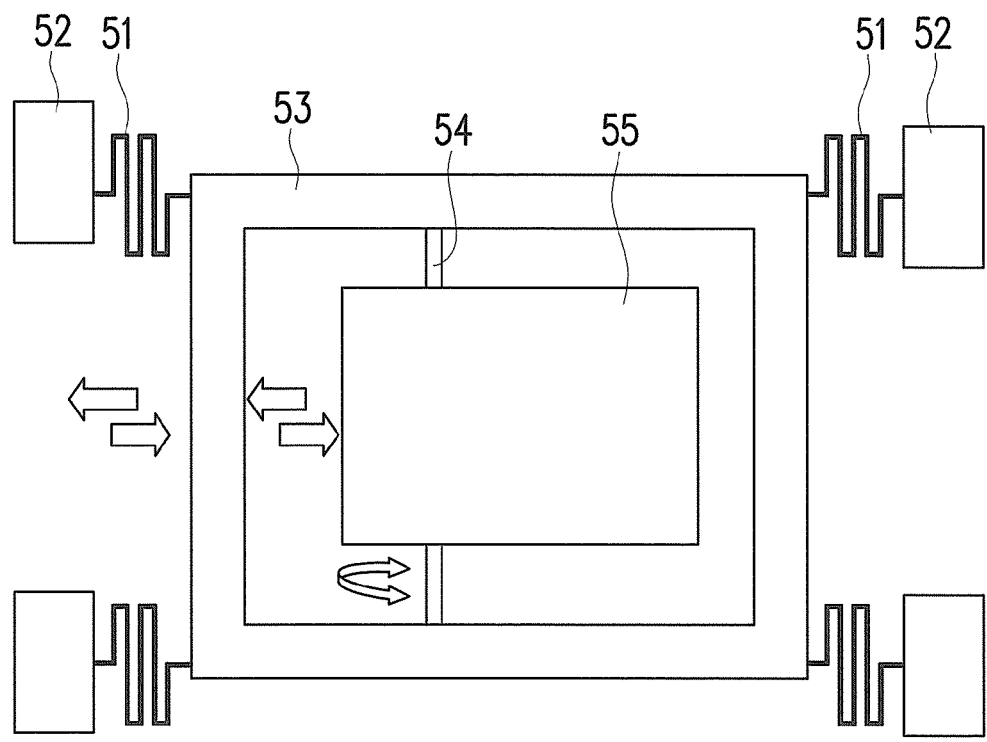
Figure 2C:
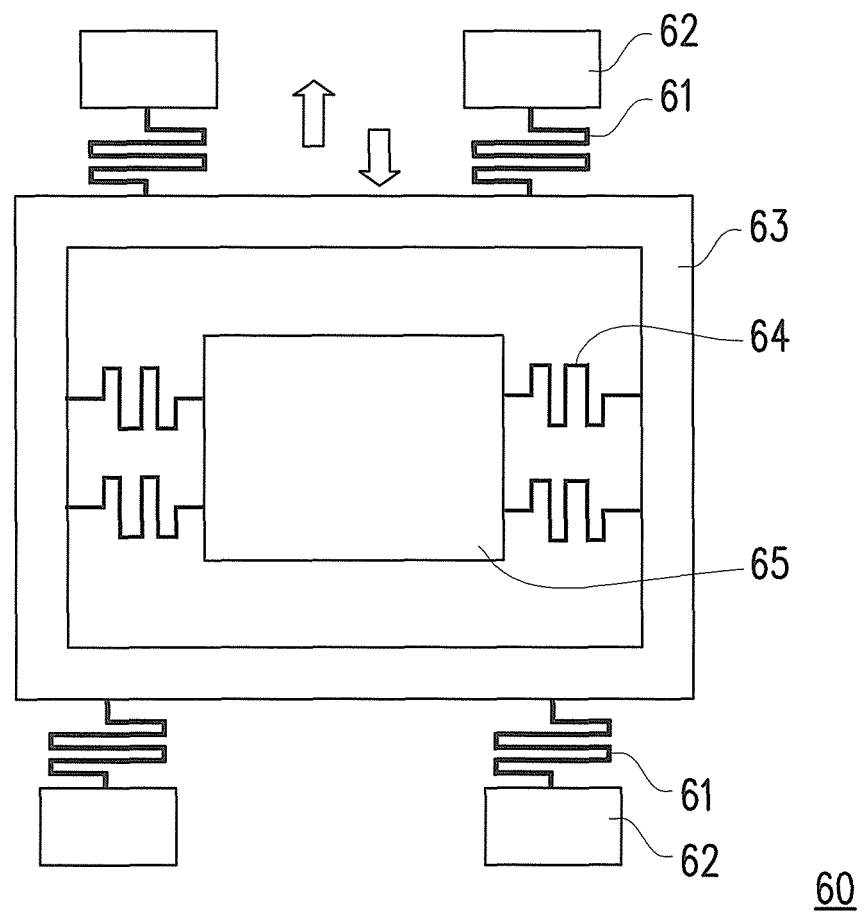
FIG. 2C is a schematic diagram of a known Z-axis gyroscope.
Figure 2D:
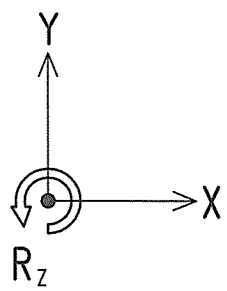
FIG. 2D is a schematic diagram of another known Z-axis gyroscope.
Figure 2D:
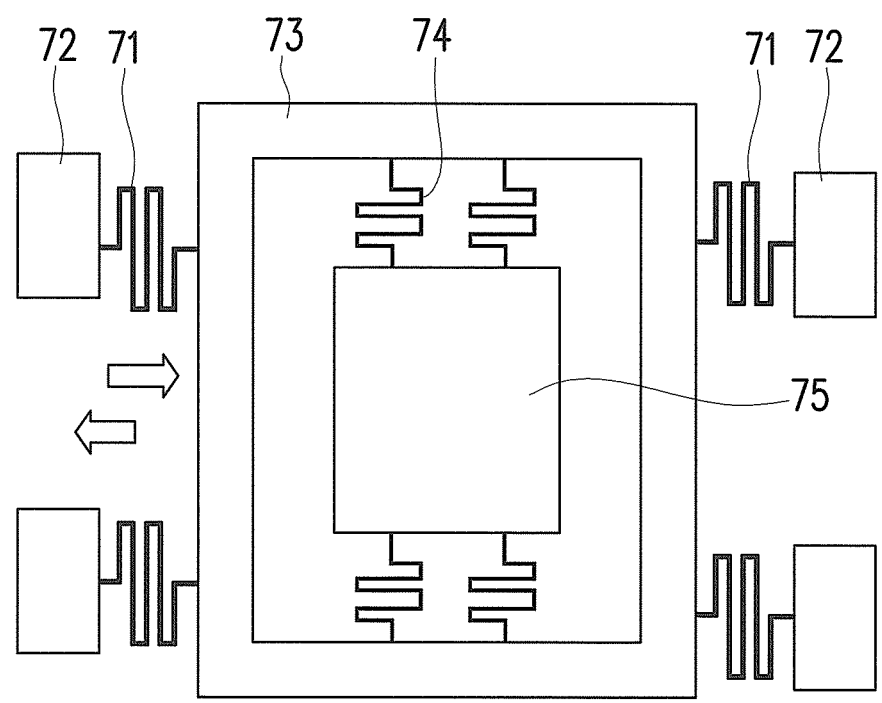
Figure 3:
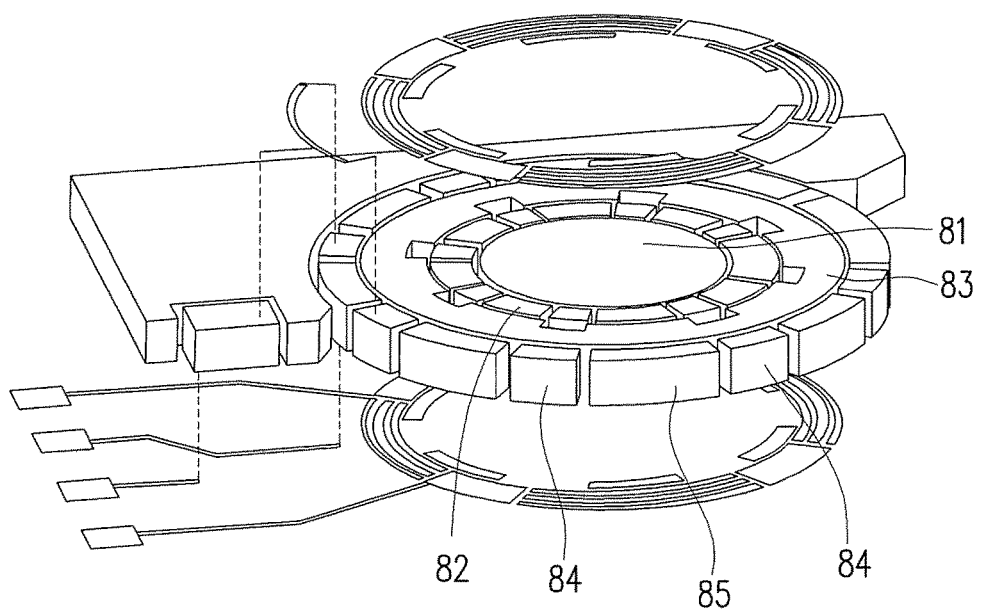
FIG. 3 is a schematic diagram of a known inertial measurement unit.
Figure 4:
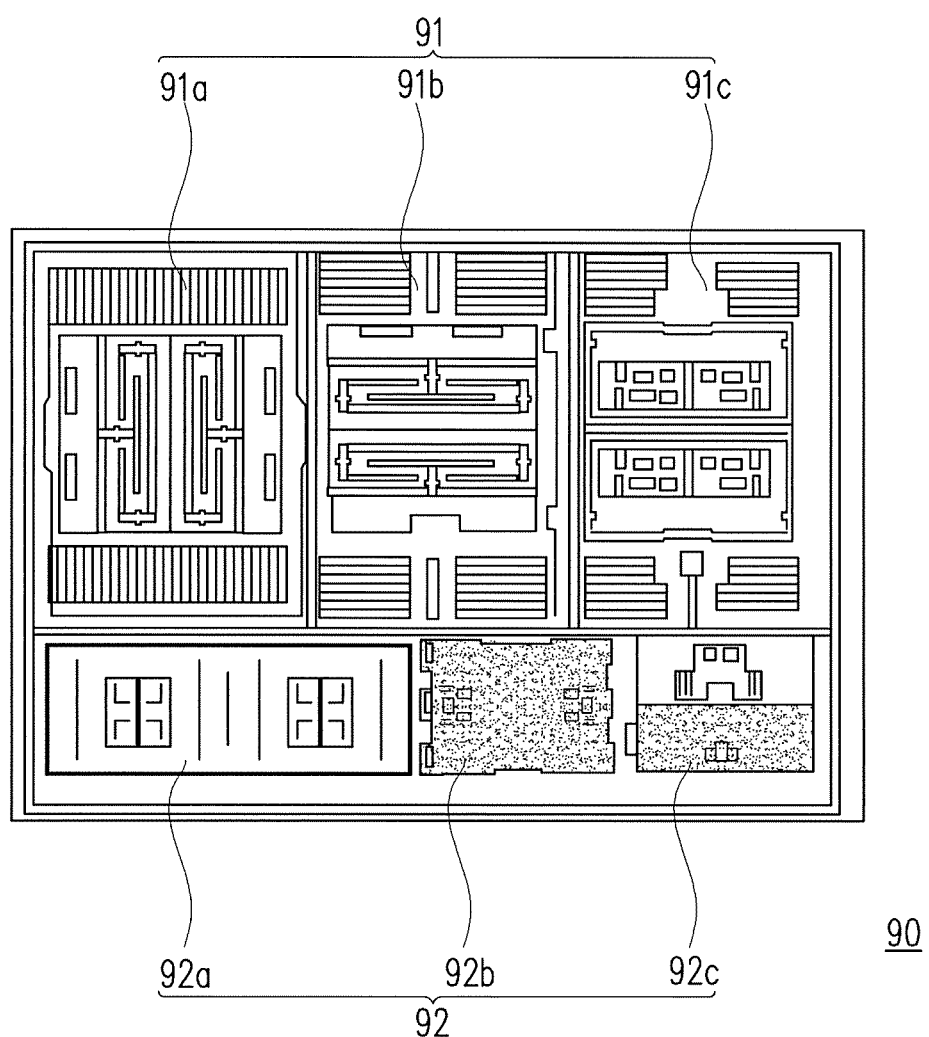
FIG. 4 is a schematic diagram of a known inertial measurement unit.
Figure 5:
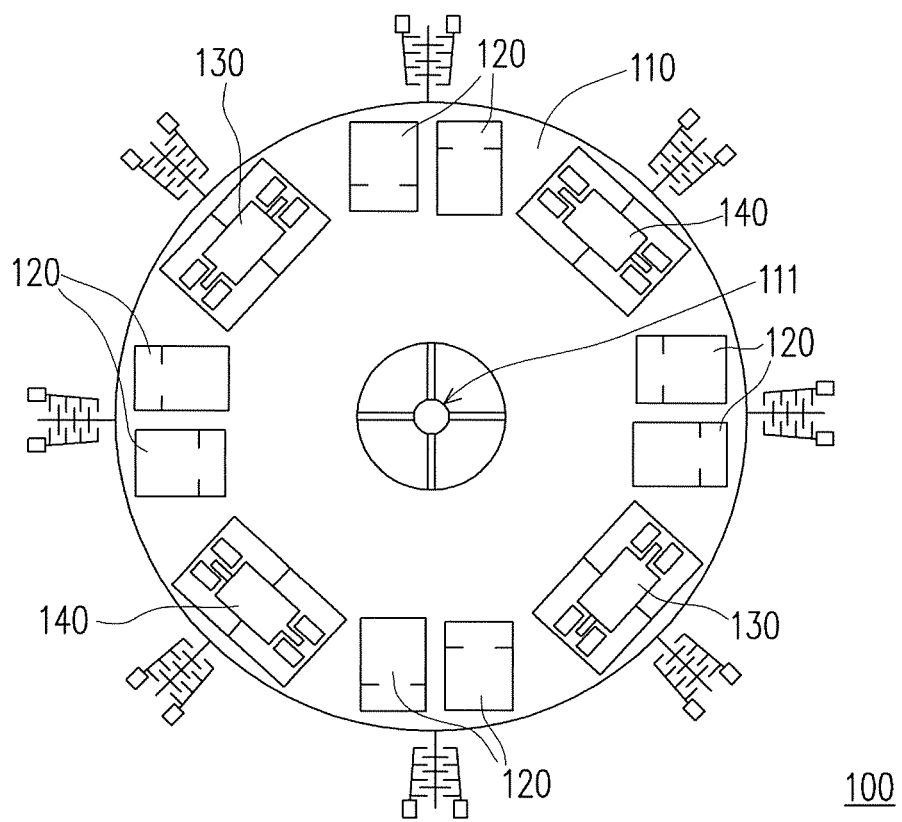
FIG. 5 is a schematic diagram of a known three-axis gyroscope.
Figure 6:
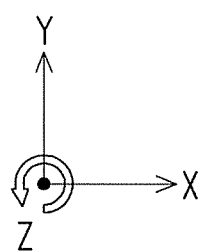
FIG. 6 is a schematic diagram of a known differential gyroscope.
Figure 6:
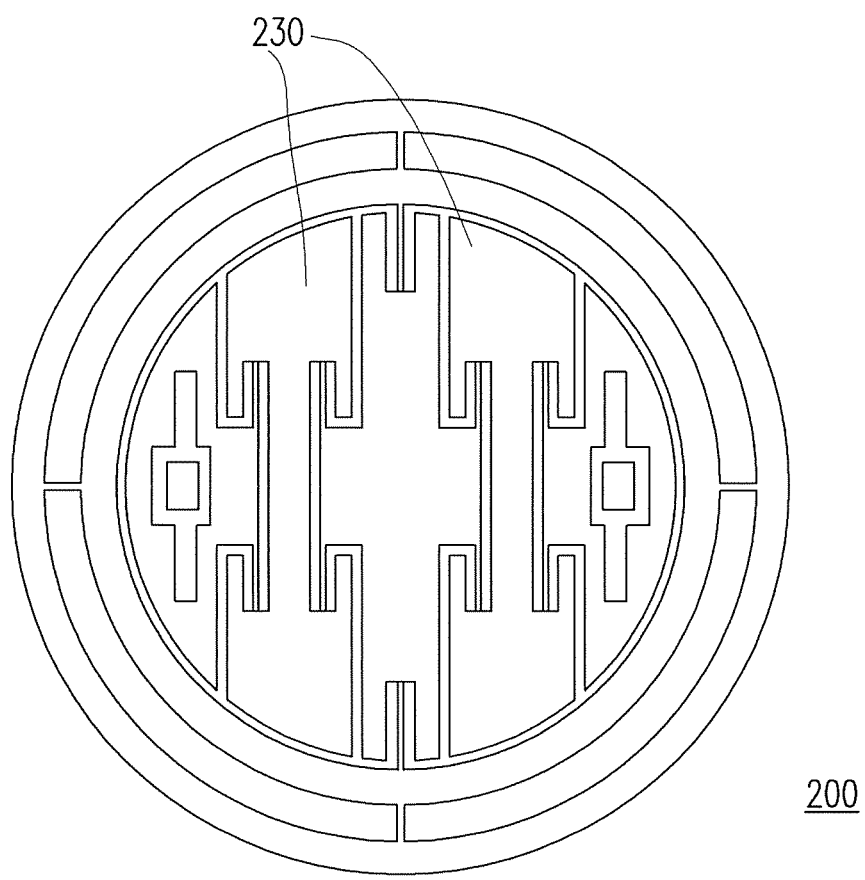
Figure 7A:
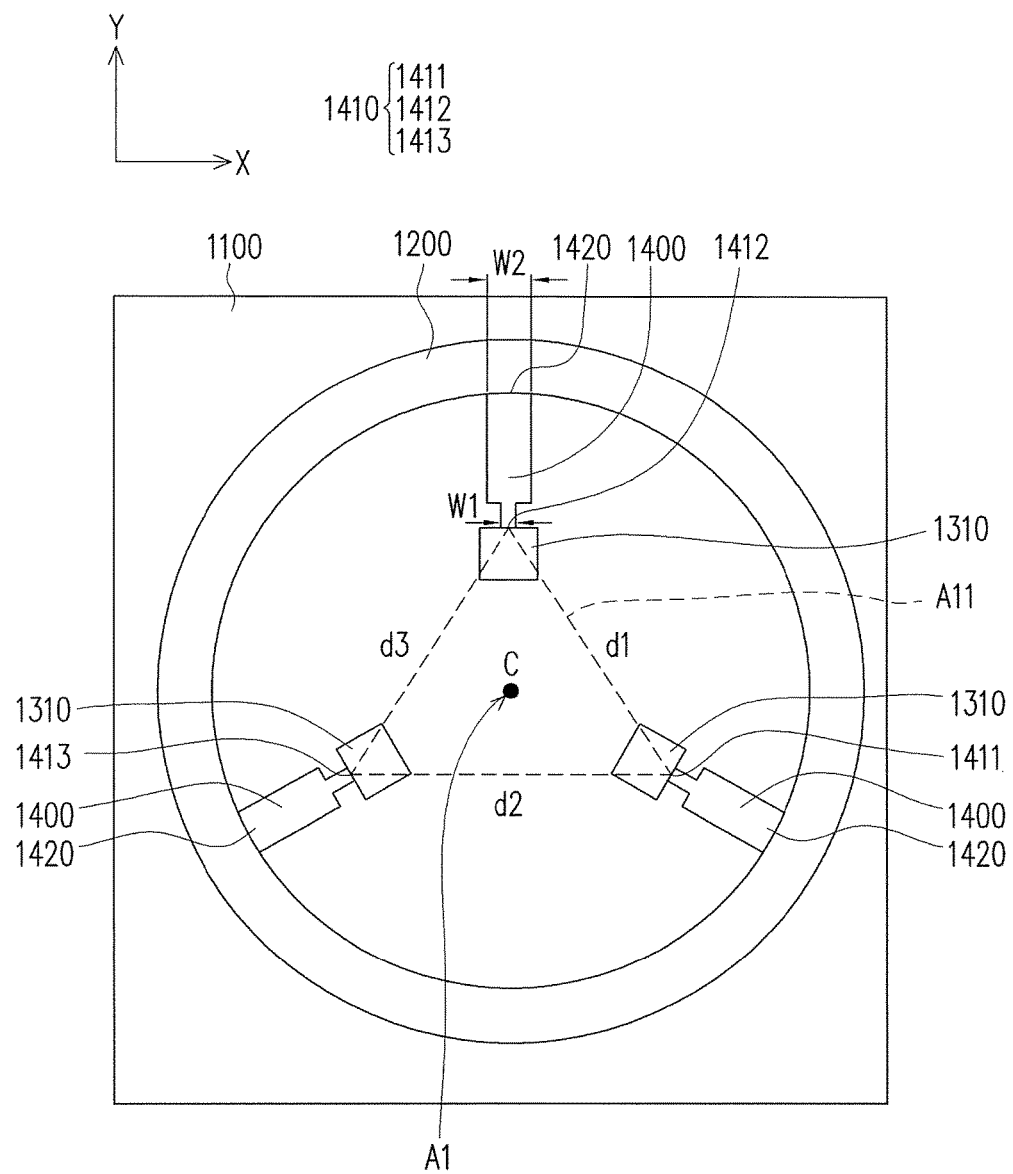
FIG. 7A is a schematic diagram of a micro-electromechanical apparatus of the first embodiment of the disclosure.

FIG. 7A is a schematic diagram of a micro-electromechanical apparatus of the first embodiment of the disclosure. Referring to FIG. 7A, in the present embodiment, a micro-electromechanical apparatus 1000A includes a substrate 1100, a first frame 1200, a plurality of first anchors 1310, and a plurality of pivot elements 1400, and a region A11. Specifically, the first frame 1200 is a frame having a hollow ring structure configured to rotate with respect to an axis A1 passing through the region A11. The axis A1 passes through a centroid C of the first frame 1200 and is extended along a direction perpendicular to the drawing. In the present embodiment, the quantity of the first anchors 1310 is three, but the disclosure is not limited thereto. The first anchors 1310 are disposed on the substrate 1100. The region A11 is disposed on the substrate 1100 and surrounded by the plurality of first anchors 1310. The plurality of first anchors 1310 and the plurality of pivot elements 1400 are surrounded by the first frame 1200. Since the first frame 1200 of the present embodiment is exemplified as a circular frame, the centroid C of the first frame 1200 can be the center of the circle.

Specifically, each of the plurality of pivot elements 1400 has the same length, and each of the pivot elements 1400 includes a pivot end 1410 and a rotary end 1420. Each of the pivot ends 1410 is connected to a corresponding first anchor 1310 and each of the rotary ends 1420 is connected to the first frame 1200 such that the first frame is capable of rotating with respect to an axis passing through the region. The region A11 can be defined as an area bounded by a finite chain of straight line segments connecting centers of two pivot ends as shown in FIG. 7A. In the present embodiment, the region A11 is a triangular region, but the disclosure is not limited thereto. In other embodiments, the region can be other shapes such as a square shape. The distance between each of the pivot ends 1410 and the axis A1 is equal to a constant. The straight line segment can be defined as the line connecting two pivot ends such as d1 or d2 or d3 in FIG. 7A. The lengths of these straight line segments d1, d2, and d3 are the same. More specifically, the pivot ends 1410 include three pivot ends 1411, 1412 and 1413. The distance d1 between a center of the pivot end 1411 and a center of the pivot end 1412 is the same as the distance d2 between a center of the pivot ends 1411 and a center of the pivot end 1413. In addition, the distance d3 between a center of the pivot end 1412 and a center of the pivot end 1413 is the same as d1 or d2. As shown in FIG. 7A, the first frame 1200 can be connected to the first anchors 1310 which are not located on the centroid C of the first frame 1200 via the pivot elements 1400. In other words, no anchor or element is disposed in the region A11 where the axis A1 passes through. Moreover, to reduce the driving force during the rotation of the first frame 1200, a width W1 of each of the pivot ends 1410 is less than a width W2 of each of the rotary ends 1420.

Figure 7B:
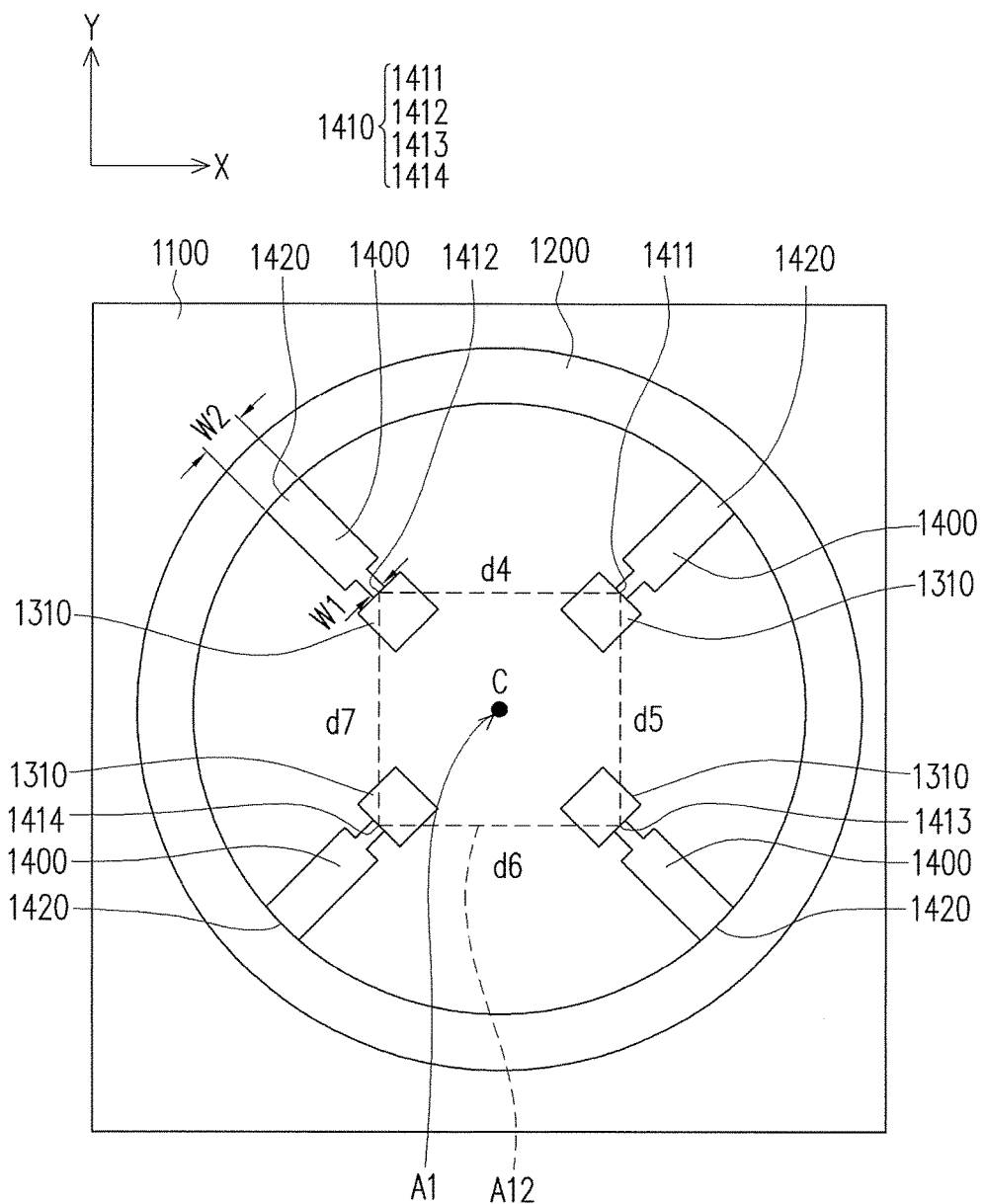
FIG. 7B is a schematic diagram of a micro-electromechanical apparatus of the second embodiment of the disclosure.

FIG. 7B is a schematic diagram of a micro-electromechanical apparatus of the second embodiment of the disclosure. Referring to FIG. 7B, the difference between a micro-electromechanical apparatus 1000B of FIG. 7B and the micro-electromechanical apparatus 1000A of FIG. 7A is: the quantity of the first anchors 1310 is four, but the disclosure is not limited thereto. In particular, a region A12 is an area bounded by a finite chain of straight line segments connecting centers of two pivot ends as shown in FIG. 7B. In the present embodiment, the region A12 is a rectangular region, but the disclosure is not limited thereto. The distance between each of the pivot ends 1410 and the axis A1 is equal to a constant. The lengths of these straight line segments d4, d5, d6, and d7 are the same. More specifically, the pivot ends 1410 include four pivot ends 1411, 1412, 1413 and 1414. The distance d4 between a center of the pivot end 1411 and a center of the pivot end 1412 is the same as the distance d5 between a center of the pivot end 1411 and a center of the pivot end 1413. The distance d6 between a center of the pivot end 1413 and a center of the pivot end 1414 is the same as the distance d5 between a center of the pivot end 1411 and a center of the pivot end 1413. And, the distance d7 between a center of the pivot end 1412 and a center of the pivot end 1414 is the same as the distance d4, d5 or d6. Moreover, no anchor or element is disposed in the region A12 where the axis A1 passes through. To reduce the driving force during the rotation of the first frame 1200, a width W1 of each of the pivot end 1410 is less than a width W2 of each of the rotary end 1420.

Figure 7C:
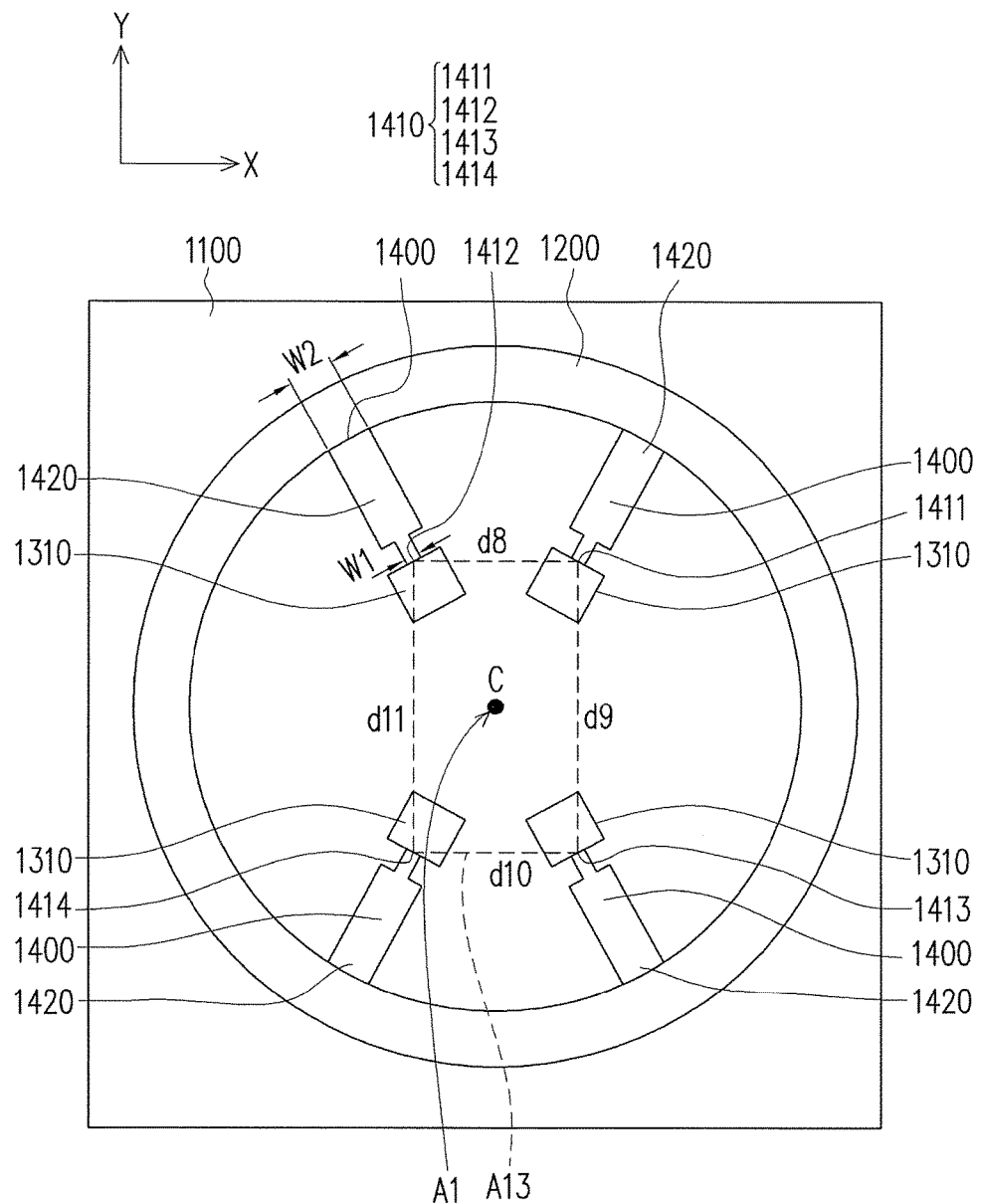
FIG. 7C is a schematic diagram of a micro-electromechanical apparatus of the third embodiment of the disclosure.

FIG. 7C is a schematic diagram of a micro-electromechanical apparatus of the third embodiment of the disclosure. Referring to FIG. 7C, the distance between each of the pivot ends 1410 and the axis A1 is equal to a constant, but the distance between each of the pivot ends 1410 and an adjacent pivot end 1410' is not the same as that between each of the pivot ends 1410 and another adjacent pivot end 1410". More specifically, the pivot ends 1410 include four pivot ends 1411, 1412, 1413 and 1414. A distance d8 between a center of the pivot end 1411 and a center of the pivot end 1412 is equal to a distance d10 between a center of the pivot end 1413 and a center of the pivot end 1414. In addition, a distance d9 between a center of the pivot end 1411 and a center of the pivot end 1413 is equal to a distance d11 between a center of the pivot end 1412 and a center of the pivot end 1414. But the distance d8 is not equal to the distance d11, and the distance d9 is not equal to the distance d10. Therefore, in the present embodiment, the region A13 is, for instance, a rectangular region, but the disclosure is not limited thereto.

Figure 8:
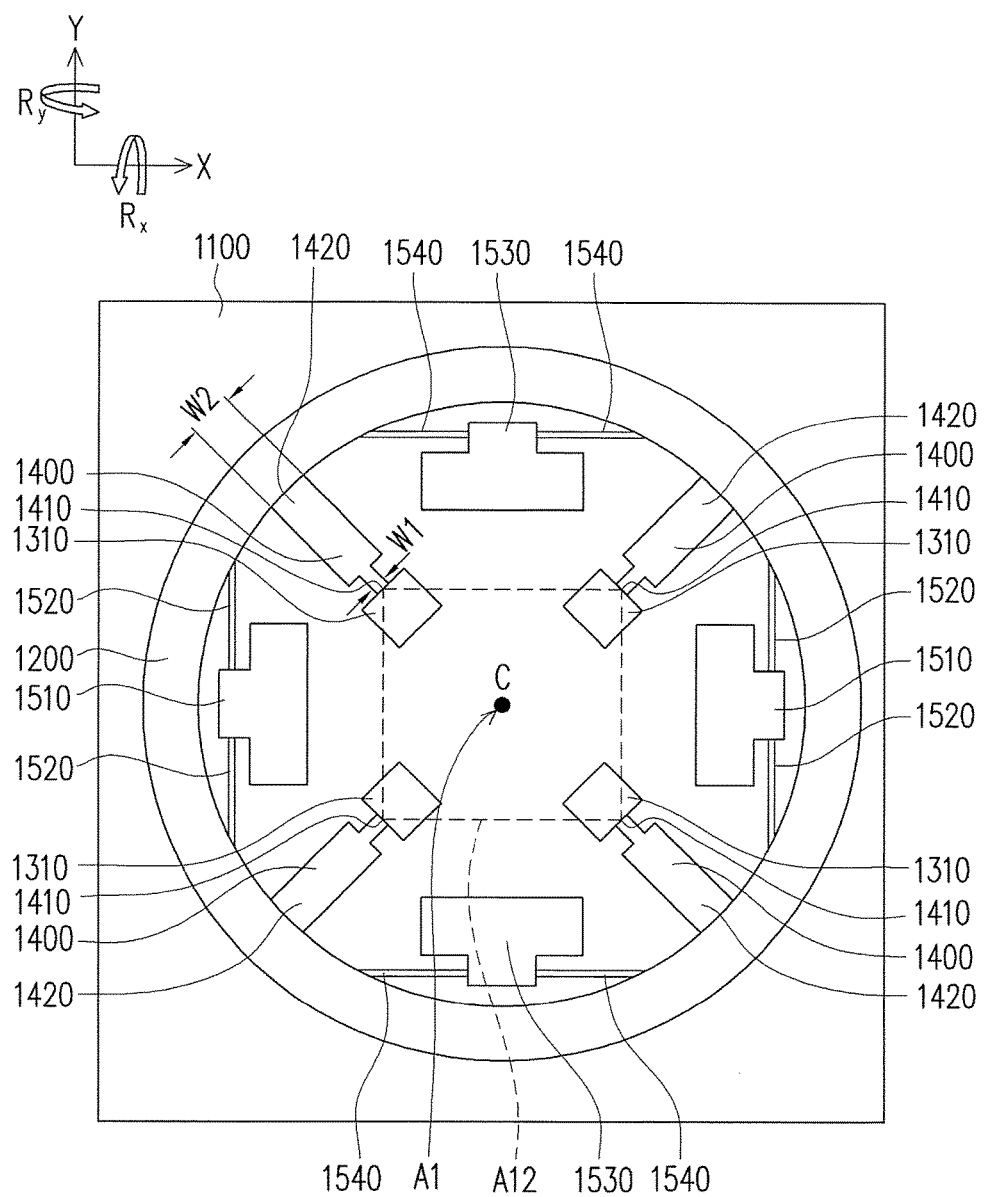
FIG. 8 is a schematic diagram of a micro-electromechanical apparatus of the fourth embodiment of the disclosure.

FIG. 8 is a schematic diagram of a micro-electromechanical apparatus of the fourth embodiment of the disclosure. Referring to FIG. 8, in the present embodiment, a micro-electromechanical apparatus 1000D is a biaxial angular velocity meter, but the disclosure is not limited thereto. The micro-electromechanical apparatus 1000D can be used for sensing angular velocities in the direction parallel to the X-axis and the direction parallel to the Y-axis. The structure of the micro-electromechanical apparatus 1000D is substantially similar to the micro-electromechanical apparatus 1000B of FIG. 7B. The difference between the two is: the micro-electromechanical apparatus 1000D further includes a plurality of first masses 1510, a plurality of first springs 1520, a plurality of second masses 1530, and a plurality of second springs 1540. Each of the first masses 1510 is disposed between the region A12 and the first frame 1200. Each of the first springs 1520 is a torsion beam, but the disclosure is not limited thereto. Each of the first springs 1520 can be connected to a corresponding first mass 1510 and the first frame 1200 along the direction parallel to the Y-axis. When the first frame 1200 of the micro-electromechanical apparatus 1000D rotates in a reciprocating manner with respect to the axis A1 and the micro-electromechanical apparatus 1000D senses an angular velocity $R_x$ in the direction parallel to the X-axis, each first mass 1510 rotates in a reciprocating manner about a corresponding first spring 1520 (i.e., the axis of rotation is parallel to the direction parallel to the Y-axis). At this point, the capacitance between each first mass 1510 and a sensing electrode (not shown) disposed on the substrate 1100 is changed accordingly. The value of the angular velocity $R_x$ can be calculated by sensing the change of capacitance caused by the rotation of the first masses 1510. Moreover, no anchor or element is disposed within the region A13 where the axis A1 passes through, wherein the axis A1 substantially passes through the centroid C. In the present embodiments, each of the first masses 1510 can be a convex mass, but the disclosure is not limited thereto.

Moreover, each of the second masses 1530 is disposed between the region A12 and the first frame 1200. Each of the second springs 1540 is a torsion beam, but the disclosure is not limited thereto. Each of the second springs 1540 can be connected to a corresponding second mass 1530 and the first frame 1200 along the direction parallel to the X-axis. When the first frame 1200 of the micro-electromechanical apparatus 1000D rotates in a reciprocating manner with respect to the axis A1 and the micro-electromechanical apparatus 1000D senses an angular velocity $R_y$ in the direction parallel to the Y-axis, each of the second masses 1530 rotates in a reciprocating manner about a corresponding second spring 1540 (i.e., the axis of rotation is parallel to the direction parallel to the X-axis). At this point, the capacitance between each of the second masses 1530 and a sensing electrode (not shown) disposed on the substrate 1100 is changed accordingly. The value of the angular velocity $R_y$ can be calculated by sensing the change of capacitance caused by the rotation of each of the second masses 1530. In the present embodiment, each of the second masses 1530 can be a convex mass, but the disclosure is not limited thereto.

Figure 9:
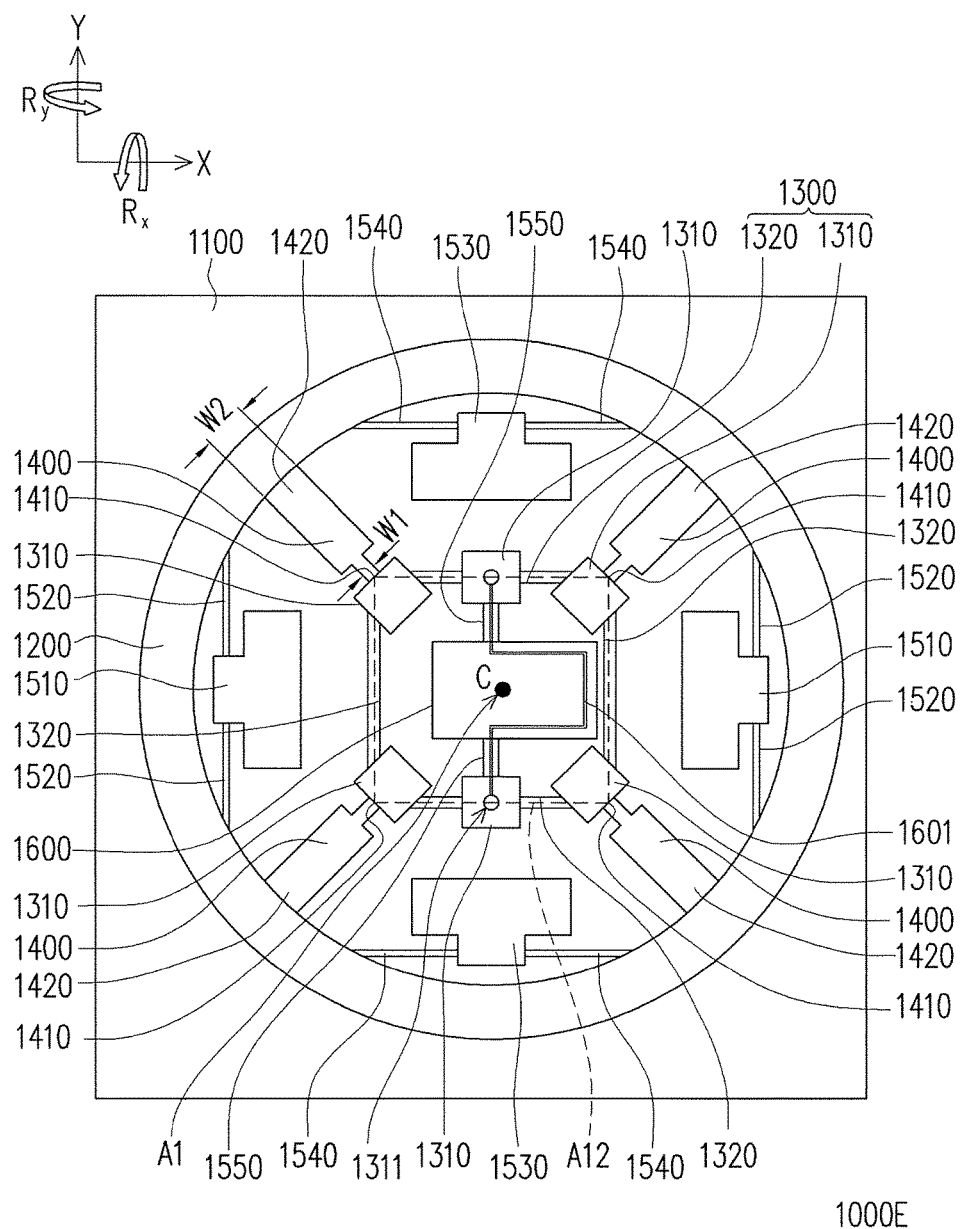
FIG. 9 is a schematic diagram of a micro-electromechanical apparatus of the fifth embodiment of the disclosure.

FIG. 9 is a schematic diagram of a micro-electromechanical apparatus of the fifth embodiment of the disclosure. Referring to FIG. 9, in the present embodiment, a micro-electromechanical apparatus 1000E is an inertial measurement unit (IMU) integrating a biaxial angular velocity meter and a magnetometer, but the disclosure is not limited thereto. The micro-electromechanical apparatus 1000E can be used for sensing angular velocities in the directions parallel to the X-axis and the Y-axis and magnetic field strength in the direction parallel to the X-axis. The structure of the micro-electromechanical apparatus 1000E is substantially similar to the micro-electromechanical apparatus 1000D of FIG. 8. The difference between the two apparatus is: the micro-electromechanical apparatus 1000E further includes a plurality of second anchors 1320 and a sensor 1600. Each of the second anchors 1320 is disposed on the substrate 1100 and connected to the first anchors 1310 to form a ring anchor 1300. The sensor 1600 is disposed on the substrate 1100 and located within the region A12. The sensor 1600 is surrounded by the ring anchor 1300. Moreover, no anchor is disposed within the region A12 where the axis A1 passes through. It can also be found that the axis A1 substantially passes through the centroid C. In the present embodiment, the sensor 1600 is a magnetometer, but the disclosure is not limited thereto. The sensor 1600 is adapted for sensing magnetic field strength in the direction parallel to the X-axis.

Specifically, the sensor 1600 can be connected to the ring anchor 1300 via third springs 1550 extending along the direction parallel to the Y-axis. The sensor 1600 is connected to the first anchors 1310 via the third springs 1550. Moreover, the third springs 1550 are connected to the sensor 1600 eccentrically. In the present embodiment, six first anchors 1310 are disposed on the substrate around the centroid C. The first anchors 1310 are connected by second anchors 1320 to form the rectangular ring anchor 1300. In the present embodiment, the third springs 1550 are connected to the sensor 1600 and the first anchors 1310 in a direction parallel to the Y-axis. The disclosure does not limit the method by which the third springs 1550 are connected to the sensor 1600. The disclosure also does not limit the quantity and the location of the first anchors 1310. For instance, in another embodiment, the third springs 1550 can be connected to the sensor 1600 and the second anchors 1320 in a direction parallel to the X-axis. Moreover, a conductive coil 1601 of the sensor 1600 is connected to the first anchors 1310 and is electrically connected to a conductive via 1311 in the first anchors 1310.

In short, an interference from the oscillation of the first frame 1200 can be avoided by disposing the sensor 1600 within the region A12 (i.e., within the ring anchor 1300). Furthermore, the overall area of the micro-electromechanical apparatus 1000E is not increased. Although the sensor 1600 of the above embodiments is exemplified as a magnetometer, in an embodiment, the sensor 1600 can be an three axis accelerometer. The disclosure does not limit the function of the sensor 1600 disposed within the region A12. Moreover, in the present embodiment, the region A12 can be a rectangular region, but the disclosure is not limited thereto.

Figure 10:
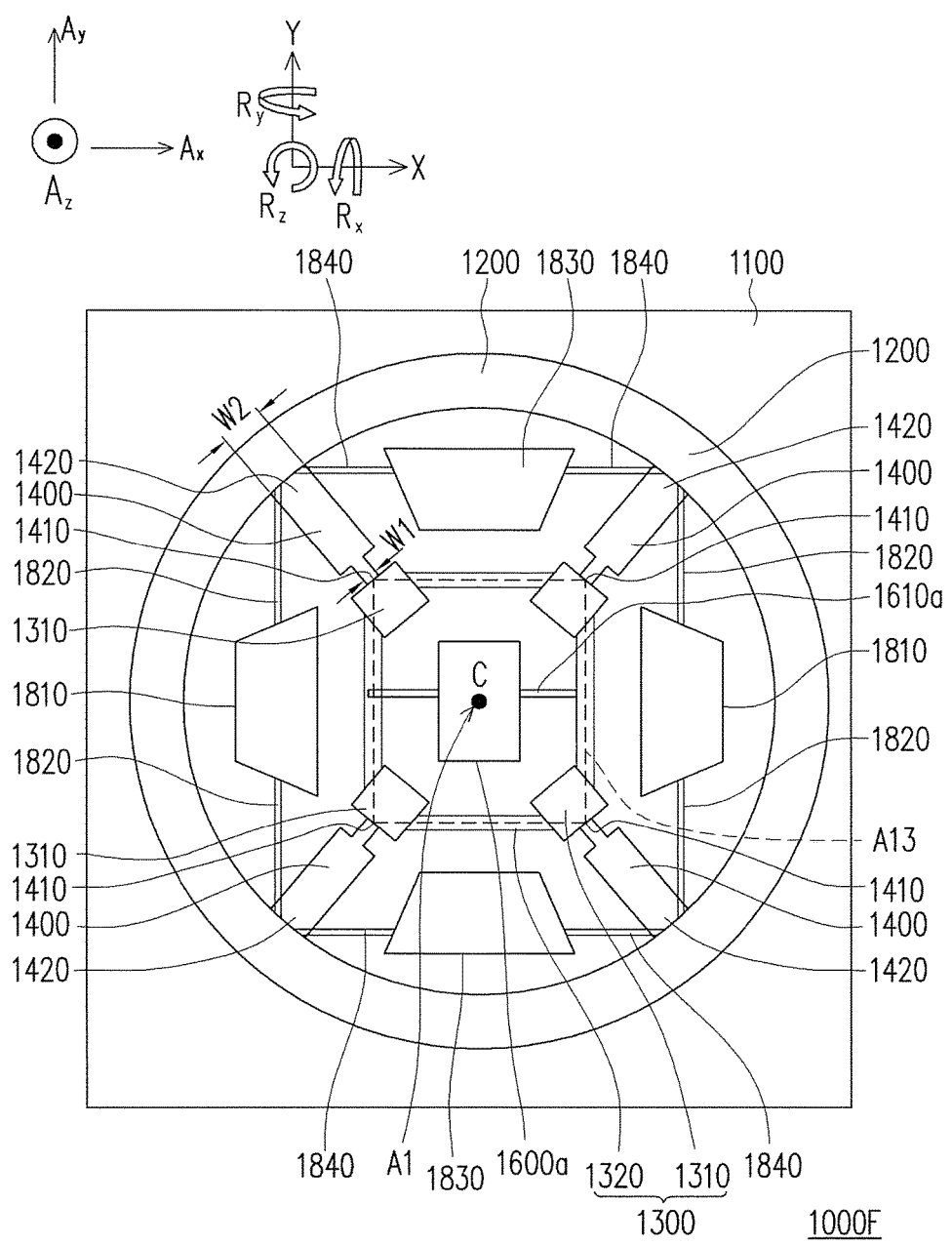
FIG. 10 is a schematic diagram of a micro-electromechanical apparatus of the sixth embodiment of the disclosure.

FIG. 10 is a schematic diagram of a micro-electromechanical apparatus of the sixth embodiment of the disclosure. Referring to FIG. 10, in the present embodiment, a micro-electromechanical apparatus 1000F is adapted for sensing angular velocities in two directions (e.g. the direction parallel to the X-axis and the direction parallel to the Y-axis) and acceleration in one direction (e.g. the direction parallel to the Z-axis). The difference between the micro-electromechanical apparatus 1000F and the micro-electromechanical apparatus 1000B of FIG. 8 is: the micro-electromechanical apparatus 1000F further includes a plurality of second anchors 1320. Specifically, each of the second anchors 1320 is connected to the first anchors 1310 to form the ring anchor 1300. Each of the first masses 1810 is an unbalance mass which is disposed between the region A13 and the first frame 1200. In the present embodiment, each of the first masses 1810 can be trapezoidal, but the disclosure is not limited thereto. Each of the first springs 1820 is connected to a corresponding first mass 1810 and the first frame 1200 along the direction parallel to the Y-axis. Therefore, when the micro-electromechanical apparatus 1000F senses the angular velocity $R_x$ in the direction parallel to the X-axis, each of the first masses 1810 rotates in a reciprocating manner about a corresponding first spring 1820 (i.e., the axis of rotation is parallel to the Y-axis). The value of the angular velocity $R_x$ can be calculated by sensing the change of capacitance caused by the rotation of each of the first masses 1810.

Moreover, each of the second masses 1830 is an unbalance mass which is disposed between the region A13 and the first frame 1200. In the present embodiment, each of the second masses 1830 can be trapezoidal, but the disclosure is not limited thereto. Each of the second springs 1840 is connected to a corresponding second mass 1830 and the first frame 1200 along the direction parallel to the X-axis. Therefore, when the micro-electromechanical apparatus 1000F senses the angular velocity $R_y$ in the direction parallel to the Y-axis, each of the second masses 1830 rotates in a reciprocating manner about a corresponding second spring 1840 the axis of rotation (i.e., the axis of rotation is parallel to the X-axis). The value of the angular velocity $R_y$ can be calculated by sensing the change of capacitance caused by the rotation of each of the second masses 1830.

In comparison to the micro-electromechanical apparatus 1000B of FIG. 8, the micro-electromechanical apparatus 1000F further includes a sensor 1600a that is disposed on the substrate 1100 and is surrounded by the ring anchor 1300. In the present embodiment, the sensor 1600a can be an accelerometer, but the disclosure is not limited thereto. The sensor 1600a is adapted for sensing acceleration in the direction parallel to the Z-axis. Specifically, a torsion beam 1610a extending along the direction parallel to the X-axis is connected to the ring anchors 1300 and is eccentrically connected to the sensor 1600a. Therefore, when the micro-electromechanical apparatus 1000F detects an acceleration $A_z$ in the direction parallel to the Z-axis, the masses rotate in a reciprocating manner about the torsion beam 1610a (i.e., the axis of rotation is parallel to the X-axis). The value of the acceleration $A_z$ in the direction parallel to the Z-axis can be calculated by sensing the change of capacitance caused by the rotation of the sensor 1600a.

Figure 11A:
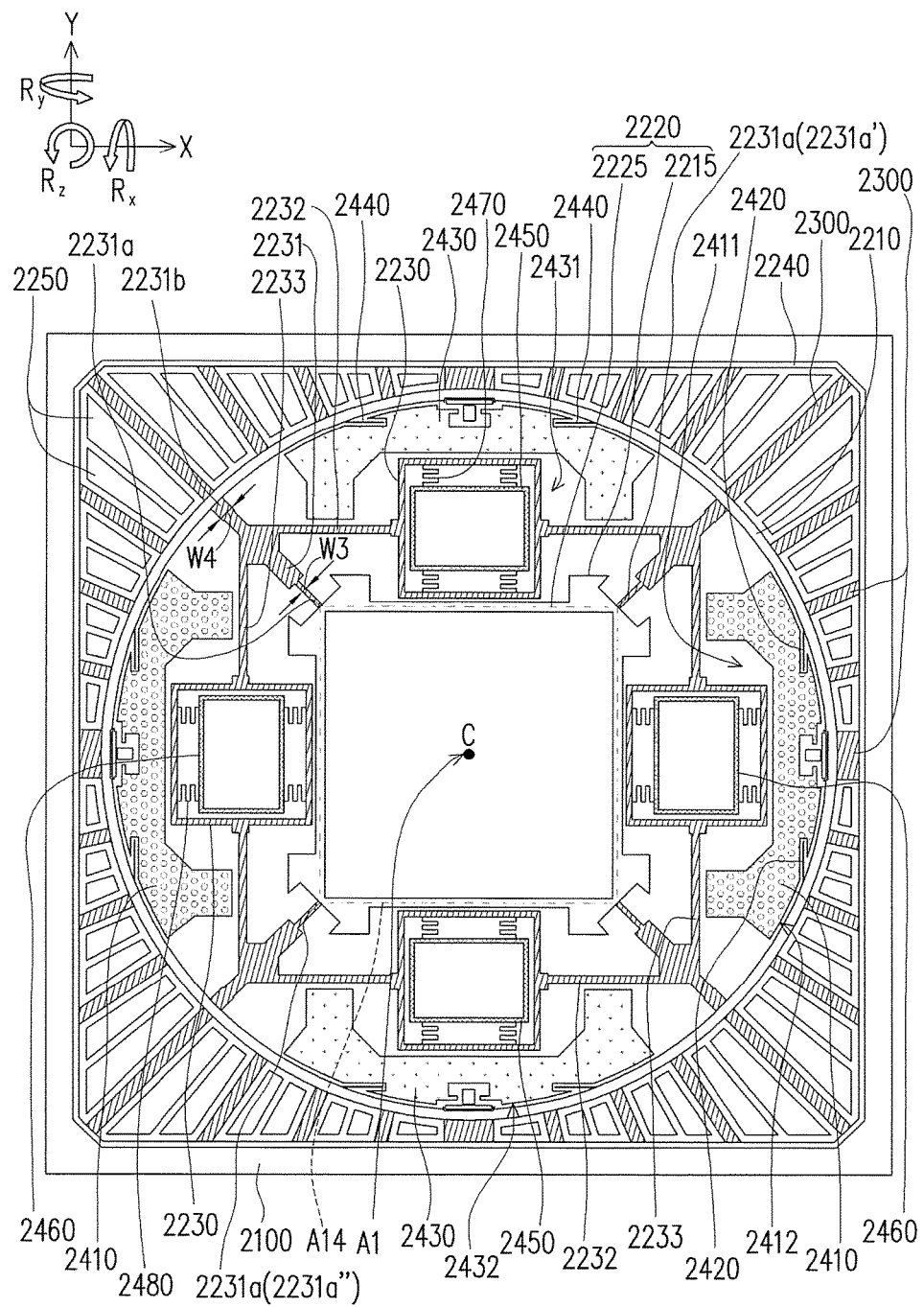
FIG. 11A is a schematic diagram of a micro-electromechanical apparatus of the seventh embodiment of the disclosure.

FIG. 11A is a schematic diagram of a micro-electromechanical apparatus of the seventh embodiment of the disclosure. Referring to FIG. 11A, in the present embodiment, a micro-electromechanical apparatus 2000 is adapted for detecting angular velocities in the at least two directions. The micro-electromechanical apparatus 2000 includes a substrate 2100, a first frame 2210, a ring anchor 2220 which includes a plurality of first anchors 2215 and a plurality of second anchors 2225, a plurality of pivot elements 2231, a plurality of first supports 2232 and a plurality of second supports 2233, a second frame 2240, and a plurality of connectors 2300.

The first frame 2210 is an oscillating frame having a circular ring structure, but the disclosure is not limited thereto. The first frame 2210 is configured to rotate with respect to the axis A1 passing through the region A14. The axis A1 passes through the centroid C of the first frame 2210 and is extended along a direction perpendicular to the substrate 2100. The plurality of first anchors 2215 are disposed on the substrate 2100, and the first frame 2210 surrounds the plurality of first anchors 2215. In the present embodiment, the region A14 can be a square area, but the disclosure is not limited thereto. Since the first frame 2210 of the present embodiment is exemplified as a circular ring frame, the center of the first frame 2210 is the geometric center thereof. In the present embodiment, the first frame 2210 is connected to the first anchors 2215 by the pivot elements 2231 within the first frame 2210. Specifically, each of the pivot elements 2231 includes a pivot end 2231a and a rotary end 2231b, wherein each of the pivot ends 2231a is connected to the first anchors 2215 and each of the rotary ends 2231b is connected to the first frame 2210 such that the first frame 2210 is capable of rotating with respect to an axis A1 passing through the region A14. The region A14 is a square area bounded by a finite chain of straight line segments connecting two pivot ends as shown in FIG. 11A. The distance between each of the pivot ends 2231a and the axis A1 is equal to a constant. The distance between each of the pivot ends 2231a and it's adjacent pivot end 2231a' is the same as that between each of the pivot ends 2231a and another adjacent pivot end 2231a". In other words, the first frame 2210 is connected to the first anchors 2215 which are not located in the area around centroid C via each of the pivot elements 2231. Moreover, no anchor or element is disposed within the region A14 where the axis A1 passes through. Furthermore, the plurality of second anchors 2225 can be disposed on the substrate 2100 and can be connected to the first anchors 2215 to form the ring anchor 2220 in which the additional sensor can be disposed.

In detail, each of the first supports 2232 and a corresponding second support 2233 are respectively connected to a corresponding pivot element 2231, wherein each of the first supports 2232 and each of the second supports 2233 are connected to a corresponding pivot element 2231 symmetrically. In the present embodiment, each of the first supports 2232 and a corresponding second support 2233 are perpendicular to each other. In other words, the angle between each of the first supports 2232 and a corresponding pivot element 2231 and the angle between each of the second supports 2233 and a corresponding pivot element 2231 are all 45 degrees. In the present embodiment, the first supports 2232, the pivot elements 2231, and the second supports 2233 can form a trident-shaped support (i.e., the shape of the support is similar to a trident) as shown in FIG. 11A. In the present embodiment, four groups of trident-shaped supports are respectively disposed near four corners of the ring anchor 2220. As shown in FIG. 11A, each pivot element of the trident-shaped support connects the ring anchor 2220 and each of the first supports 2232 and the second supports 2233 are respectively connected to a corresponding third frame 2230. Moreover, a width W3 of the pivot end 2231a is less than a width W4 of the rotary end 2231b such that the first frame 2210 can be rotated by smaller driving force.

In the present embodiment, the second frame 2240 surrounds the first frame 2210, and the connectors 2300 are connected to the first frame 2210 and the second frame 2240 to form a double-ring type oscillator suspended above the substrate 2100. Moreover, a moving electrode having a finger structure (not shown) is disposed on the connectors 2300. As shown in FIG. 11A, the micro-electromechanical apparatus 2000 further includes a plurality of fixed electrodes 2250 disposed on the substrate 2100 and disposed between the first frame 2210 and the second frame 2240. Specifically, the fixed electrodes 2250 are surrounded by the first frame 2210, the second frame 2240, and the connectors 2300, wherein each of the fixed electrodes 2250 is not in contact with the first frame 2210, the second frame 2240, and the connectors 2300. Therefore, the overall area of the micro-electromechanical apparatus 2000 can be reduced.

Moreover, the micro-electromechanical apparatus 2000 further includes a plurality of first masses 2410, a plurality of first springs 2420, a plurality of second masses 2430, a plurality of second springs 2440, a plurality of third masses 2450, 2460, and a plurality of third springs 2470, 2480. The first masses 2410, the second masses 2430, and the plurality of third masses 2450 and 2460 are respectively used for detecting the angular velocity $R_x$ in the direction parallel to the X-axis, the angular velocity $R_y$ in the direction parallel to the Y-axis, and the angular velocity $R_z$ in the direction parallel to the Z-axis.

Each of the first masses 2410 is respectively disposed between the first frame 2210 and the ring anchor 2220 (i.e., between the first frame 2210 and the region A14). Each of the first springs 2420 is eccentrically connected to a corresponding first mass 2410 and the first frame 2210 along the direction parallel to the Y-axis. In other words, a connecting line which connects the two first springs 2420 does not pass through the center of mass of the first masses 2410. As a result, the first masses 2410 become unbalance masses. The first springs 2420 can be one of the springs capable of making the first masses 2410 rotate freely about the axis parallel to the Y-axis. For instance, each of the first springs 2420 can be a torsion beam, but the disclosure is not limited thereto. Therefore, the first frame 2210 of the micro-electromechanical apparatus 2000 rotates in a reciprocating manner with respect to the axis A1 passing through the region A14 to drive each of the first masses 2410 to move back and forth along the direction parallel to the Y-axis. When the micro-electromechanical apparatus 2000 senses the angular velocity $R_x$ in the direction parallel to the X-axis, each of the first masses 2410 rotates in a reciprocating manner about a corresponding first spring 2420 (i.e., the axis of rotation is parallel to the Y-axis) to cause change of capacitance between the first masses 2410 and a sensing electrode (not shown) disposed on the substrate 2100. The value of the angular velocity $R_x$ in the direction parallel to the X-axis can be calculated by sensing the change of capacitance caused by the rotation of each of the first masses 2410.

Each of the second masses 2430 is disposed between the first frame 2210 and the ring anchor 2220 (i.e., between the region A14 and the first frame 2210). Each of the second springs 2440 is eccentrically connected to a corresponding second mass 2430 and the first frame 2210 along the direction parallel to the X-axis. In other words, a connecting line which connects the two second springs 2440 does not pass through the center of mass of the second masses 2430. As a result, the second masses 2430 also become unbalance masses. The second springs 2440 can be one of the springs capable of making the second masses 2430 have degree of freedom of rotating about the axis parallel to the X-axis. Each of the second springs 2440 can be a torsion beam, but the disclosure is not limited thereto. Therefore, the first frame 2210 of the micro-electromechanical apparatus 2000 rotates in a reciprocating manner with respect to the axis A1 passing through the region A14 to drive each of the second masses 2430 moves back and forth along the direction parallel to the X-axis. When the micro-electromechanical apparatus 2000 senses the angular velocity $R_y$ in the direction parallel to the Y-axis, each of the second masses 2430 rotates in a reciprocating manner about a corresponding second spring 2440 (i.e., the axis of rotation is parallel to the X-axis). The value of the angular velocity $R_y$ in the direction parallel to the Y-axis can be calculated by sensing the change of capacitance caused by the rotation of each of the second masses 2430.

Each of the third frames 2230 is respectively disposed between the first frame 2210 and the ring anchor 2220 (i.e., between the region A14 and the first frame 2210). The third masses 2450 and 2460 are respectively disposed within corresponding third frames 2230 as shown in FIG. 11A. In the present embodiment, the third springs 2470 are connected to the third masses 2450 and the corresponding third frames 2230 along the direction parallel to the Y-axis, and the third springs 2480 are connected to the third masses 2460 and the corresponding third frames 2230 along the direction parallel to the X-axis. Each of the first supports 2232 is respectively connected to a corresponding third frame 2230 along the direction parallel to the X-axis, and each of the second supports 2233 is respectively connected to a corresponding third frame 2230 along the direction parallel to the Y-axis. As a result, when the first frame 2210 of the micro-electromechanical apparatus 2000 rotates in a reciprocating manner with respect to the axis A1, the third frames 2230 connected by first support 2232 move back and forth along the direction parallel to the X-axis and the third frames 2230 connected by second support 2233 move back and forth along the direction parallel to the Y-axis. Moreover, the third masses 2450 move back and forth along the direction parallel to the X-axis and the third masses 2460 move back and forth along the direction parallel to the Y-axis. Furthermore, when the micro-electromechanical apparatus 2000 senses the angular velocity $R_z$ in the direction parallel to the Z-axis, each of the third masses 2450 moves back and forth along the direction parallel to the Y-axis, and each of the third masses 2460 moves back and forth along the direction parallel to the X-axis. The value of the angular velocity $R_z$ in the direction parallel to the Z-axis can be calculated by sensing the change of capacitance caused by the displacement of each of the third masses 2450 and 2460.

To effectively reduce the overall area of the micro-electromechanical apparatus 2000, in the present embodiment, each of the first masses 2410 and each of the second masses 2430 can be a mass having a concave portion, but the disclosure is not limited thereto. As shown in FIG. 11A, each of the first masses 2410 respectively has a concave portion 2411, and each of the second masses 2430 respectively has a concave portion 2431. Each of the concave portions 2411 and each of the concave portions 2431 respectively face the axis A1. A portion of each of the third masses 2450 is surrounded by a corresponding concave portion 2431, and a portion of each of the third masses 2460 is surrounded by a corresponding concave portion 2411. Moreover, reducing the gap between a convex boundary 2412 of each of the first masses 2410 and the inner portion of the first frame 2210 also helps to reduce the overall area of the micro-electromechanical apparatus 2000. Similarly, reducing the gap between a convex boundary 2432 of each of the second masses 2430 and the inner portion of the first frame 2210 also helps to reduce the overall area of the micro-electromechanical apparatus 2000. Moreover, in the present embodiment, each of the third masses 2450 and 2460 can be a frame, but the disclosure is not limited thereto.

Figure 11B:
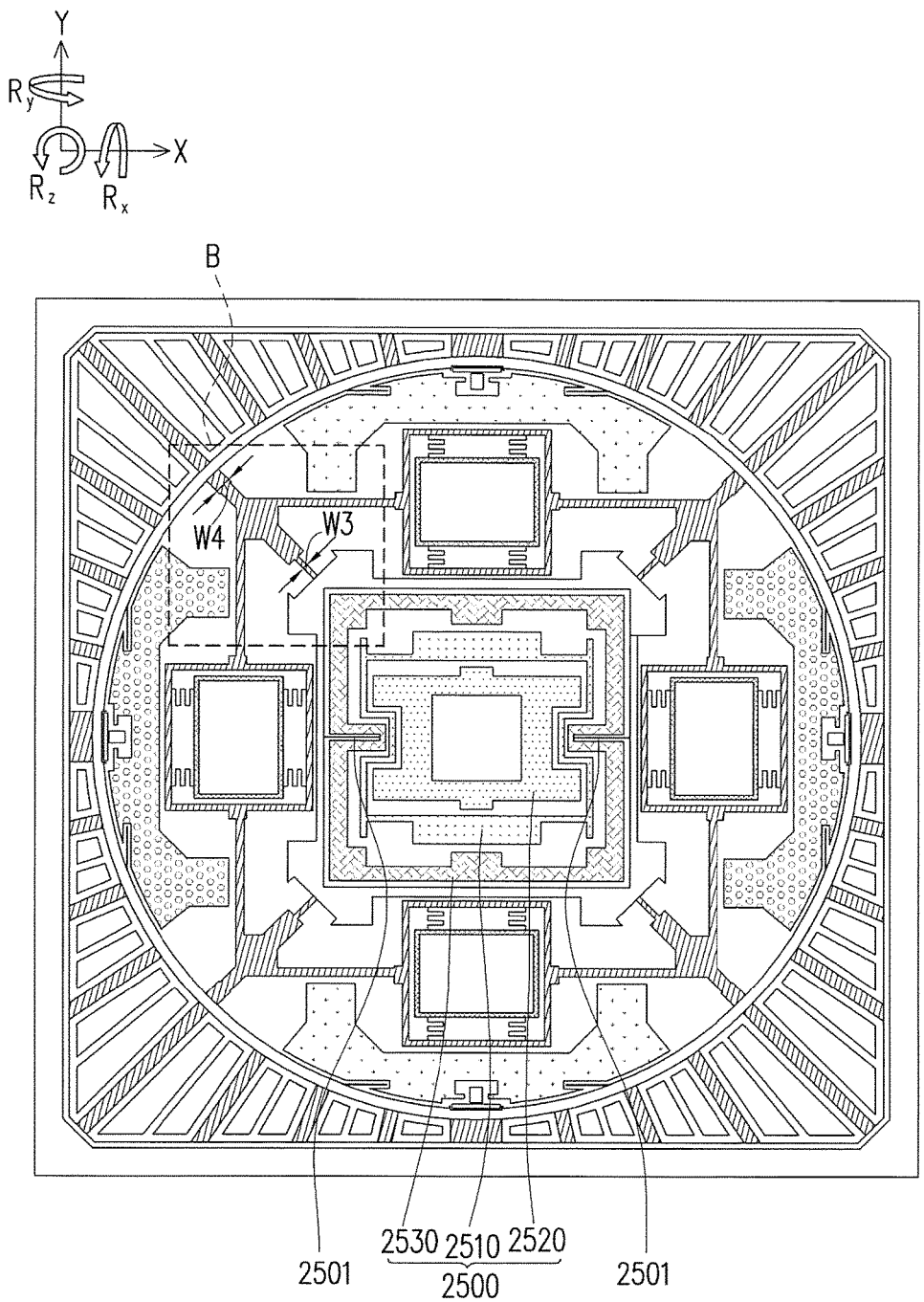
FIG. 11B is a schematic diagram of a micro-electromechanical apparatus of the eighth embodiment of the disclosure.

FIG. 11B is a schematic diagram of a micro-electromechanical apparatus of the eighth embodiment of the disclosure, wherein a micro-electromechanical apparatus 2000A of FIG. 11B is similar to the micro-electromechanical apparatus 2000 of FIG. 11A. For clarity and ease of explanation, in FIG. 11B, reference numbers of the same components are omitted, but reference numbers corresponding to a sensor 2500 are shown. Referring to FIG. 11B, the difference between the micro-electromechanical apparatus 2000A of the present embodiment and the micro-electromechanical apparatus 2000 of the sixth embodiment is: the micro-electromechanical apparatus 2000A is adapted for detecting accelerations in three directions and angular velocities in three directions. Therefore, the micro-electromechanical apparatus 2000A further includes the sensor 2500, wherein the sensor 2500 is disposed on the substrate 2100 and located within the region A14 (shown in FIG. 11A), and is surrounded by the ring anchor 2220. Specifically, the sensor 2500 is a three-axis accelerometer connected to the ring anchor 2220 via a spring 2501. The sensor 2500 can include a fourth mass 2510, a fifth mass 2520, and a sixth mass 2530, wherein the sixth mass 2530 surrounds the fourth mass 2510 and the fifth mass 2520, and the fourth mass 2510 is located between the fifth mass 2520 and the sixth mass 2530. More specifically, the fifth mass 2520 is connected to the fourth mass 2510 via a spring (not shown), and the fourth mass 2510 is connected to the sixth mass 2530 via a spring (not shown). The sixth mass 2530 is connected to the ring anchor 2220 via the spring 2501. In the present embodiment, the spring 2501 can be a torsion beam, but the disclosure is not limited thereto.

More specifically, the fourth mass 2510 is adapted for sensing an acceleration $A_x$ in the direction parallel to the X-axis. Therefore, when the micro-electromechanical apparatus 2000A detects the acceleration $A_x$ in the direction parallel to the X-axis, the fourth mass 2510 translates in the direction parallel to the X-axis, and the micro-electromechanical apparatus 2000A can calculate the value of the acceleration $A_x$ by sensing the change of capacitance caused by the translation of the fourth mass 2510.

The fifth mass 2520 is adapted for sensing an acceleration $A_y$ in the direction parallel to the Y-axis. Therefore, when the micro-electromechanical apparatus 2000A detects the acceleration $A_y$ in the direction parallel to the Y-axis, the fifth mass 2520 translates in the direction parallel to the Y-axis. The micro-electromechanical apparatus 2000A can calculate the value of the acceleration $A_y$ by sensing the change of capacitance caused by the translation of the fifth mass 2520.

The sixth mass 2530 is adapted for sensing an acceleration $A_z$ in the direction parallel to the Z-axis. Therefore, when the micro-electromechanical apparatus 2000A detects the acceleration $A_z$ in the direction parallel to the Z-axis, the sixth mass 2530 connected to the ring anchor 2220 via the spring 2501 rotates about the spring 2501 (i.e., the axis of rotation is parallel to the X-axis). The micro-electromechanical apparatus 2000A can calculate the value of the acceleration $A_z$ by sensing the change of capacitance caused by the rotation of the sixth mass 2530. In an embodiment not shown, the sixth mass 2520 can also be connected to the ring anchor 2220 along the direction parallel to the Y-axis via the spring 2501. Therefore, when the micro-electromechanical apparatus 2000A senses an acceleration in the direction parallel to the Z-axis, the sixth mass 2530 rotates about the spring 2501 (i.e., the axis of rotation is parallel to the Y-axis), and the micro-electromechanical apparatus 2000A can also calculate the value of the acceleration $A_z$ by sensing the change of capacitance caused by the rotation of the sixth mass 2530.

In short, the interference from the oscillation of the first frame 2210 can be prevented by disposing the sensor 2500 within the surrounding region A14 (shown in FIG. 11A). Furthermore, the overall area of the micro-electromechanical apparatus 2000 is not increased. Although the sensor 2500 of the above embodiments is exemplified as an accelerometer, in an embodiment, the sensor 2500 can also be a magnetometer or a barometer. However, the disclosure does not limit the function of the sensor 2500.

Figure 11C:
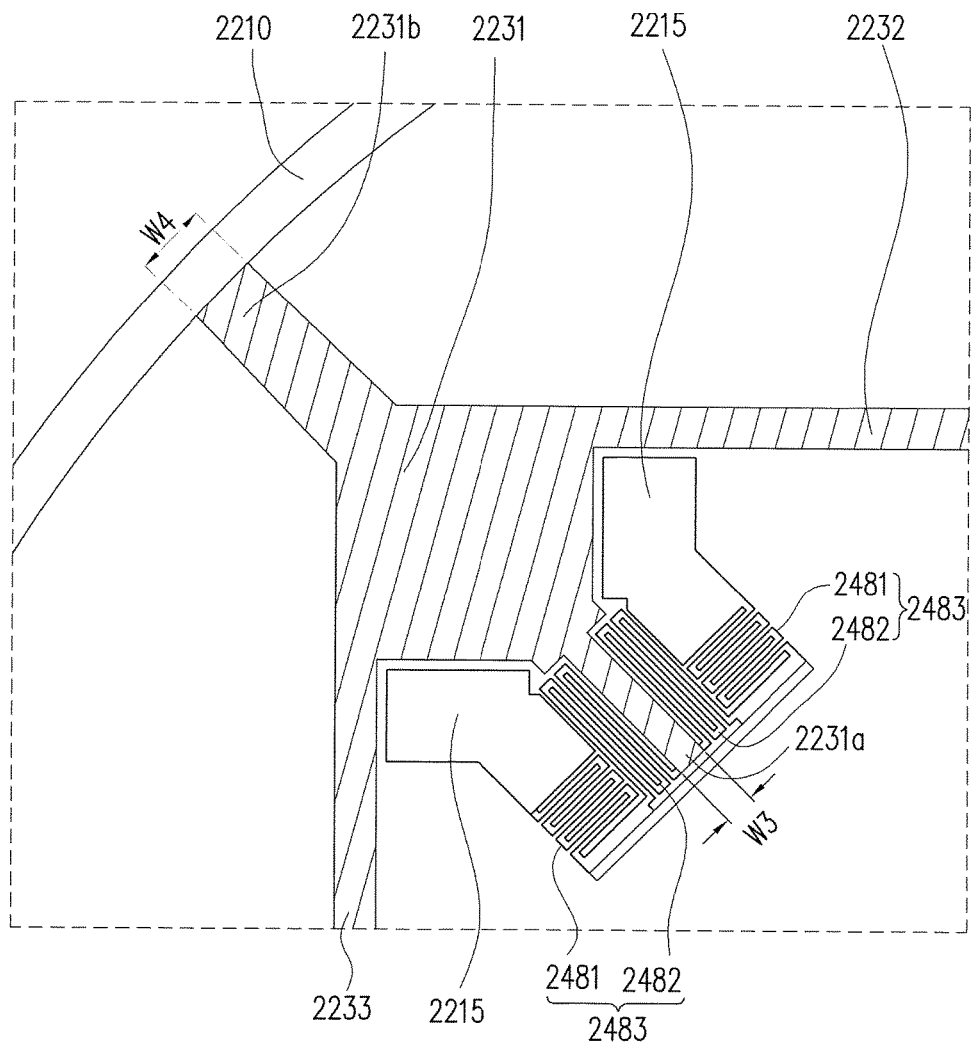
FIG. 11C is a partially enlarged schematic diagram of a micro-electromechanical apparatus of the ninth embodiment of the disclosure.

FIG. 11C is a partially enlarged schematic diagram of a micro-electromechanical apparatus of the ninth embodiment of the disclosure, wherein the partially enlarged area thereof is substantially the same as a partially enlarged area B in FIG. 11B. Referring to FIG. 11C, the difference between the micro-electromechanical apparatus of FIG. 11C and the micro-electromechanical apparatus 2000A of FIG. 11B is the connection of the pivot elements and the location of the anchors. Specifically, the micro-electromechanical apparatus of FIG. 11C further includes at least one fourth spring 2483 (one is schematically illustrated in FIG. 11C), wherein the pivot end 2231a of each of the pivot elements 2231 is connected to a corresponding first anchor 2215 via the fourth spring 2483. The fourth spring 2483 includes two folded springs 2481 and 2482 which are perpendicular to each other. Moreover, the first anchors 2215 of the micro-electromechanical apparatus of FIG. 11C are disposed on two sides of the pivot end 2231a.

The micro-electromechanical apparatus of the present embodiment follows the same technical concept as the micro-electromechanical apparatus 2000. Therefore, the engineering principles for sensing the angular velocities $R_x$, $R_y$, and $R_z$ in the micro-electromechanical apparatus of the present embodiment are the same as those described for the micro-electromechanical apparatus 2000. Moreover, the structural configurations of the same components are also as recited in the above embodiments and are not repeated herein.

Based on the embodiments mentioned above, the micro-electromechanical apparatus of the disclosure has a first frame configured to oscillate with respect to an axis passing through a region on the substrate. Specifically, the first frame is connected to the first anchors or the ring anchor via the pivot ends of the pivot elements, and the distance between each of the pivot ends and the axis is equal to a constant. In the disclosure, the pivot ends are used as pivot points but these pivot ends are not located on the axis of rotation of the first frame. As a result, the overall area of the micro-electromechanical apparatus can be reduced to achieve the purpose of miniaturization.

Moreover, the plurality of first anchors is disposed on the substrate, and a region is disposed on the substrate and surrounded by the plurality of first anchors. A sensor such as an accelerometer, a magnetometer, or a barometer can be disposed within the region. Therefore, the micro-electromechanical apparatus of the disclosure not only can sense different physical quantities such as angular velocities, acceleration, magnetic field strength, or pressure, but also can achieve the purpose of reducing the overall area.

Although the disclosure has been described with reference to the above embodiments, it will be apparent to one of the ordinary skill in the art that modifications to the described embodiments may be made without departing from the spirit of the disclosure. Accordingly, the scope of the disclosure is defined by the attached claims not by the above detailed descriptions.

What is claimed is:

1. A micro-electromechanical apparatus, comprising:
   a substrate;
   a plurality of first anchors disposed on the substrate;
   a plurality of pivot elements, wherein each of the pivot elements comprises a pivot end and a rotary end;
   a region disposed on the substrate and surrounded by the plurality of first anchors; and
   a first frame;
   wherein the plurality of first anchors and the plurality of pivot elements are surrounded by the first frame, each of the pivot ends is connected to a corresponding one of the first anchors and each of the rotary ends is connected to the first frame such that the first frame is configured to rotate with respect to an axis passing through the region, and a distance between each of the pivot ends and the axis is equal to a constant.

2. The micro-electromechanical apparatus of claim 1, wherein a width of the pivot end is less than a width of the rotary end.

3. The micro-electromechanical apparatus of claim 2, wherein no anchor is disposed in the region where the axis passes through.

4. The micro-electromechanical apparatus of claim 2, wherein a distance between the pivot end and an adjacent pivot end is the same as that between the pivot end and another adjacent pivot end.

5. The micro-electromechanical apparatus of claim 2, wherein each of the plurality of pivot elements has the same length.

6. The micro-electromechanical apparatus of claim 2, further comprising:
   at least one spring, wherein each of the pivot ends is connected to a corresponding one of the first anchors via the at least one spring.

7. The micro-electromechanical apparatus of claim 6, wherein the at least one spring includes two folded springs which are perpendicular to each other, and the two folded springs are both connected to the same pivot end and the same corresponding one of the first anchors.

8. The micro-electromechanical apparatus of claim 2, wherein a distance between the pivot end and an adjacent pivot end is not the same as that between the pivot end and another adjacent pivot end.

9. The micro-electromechanical apparatus of claim 2, further comprising:
   a sensor disposed within the region.

10. The micro-electromechanical apparatus of claim 2, further comprising:
    a plurality of second anchors disposed on the substrate, wherein each of the second anchors is connected to the first anchors to form a ring anchor.

11. The micro-electromechanical apparatus of claim 10, further comprising:
    an accelerometer connected to the ring anchor via a spring.

12. The micro-electromechanical apparatus of claim 10, further comprising:
    a magnetometer connected to the ring anchor via a spring.

13. The micro-electromechanical apparatus of claim 2, further comprising:
    a second frame surrounding the first frame; and
    a plurality of connectors respectively connected to the first frame and the second frame.

14. The micro-electromechanical apparatus of claim 13, further comprising:
    a plurality of electrodes disposed on the substrate and disposed between the first a e and the second frame.

15. The micro-electromechanical apparatus of claim 2, further comprising:
    at least one first support; and
    at least one second support, wherein the at least one first support and the at least one second support are connected to a corresponding one of the pivot elements symmetrically.

16. The micro-electromechanical apparatus of claim 15, wherein the at least one first support and the at least one second support are perpendicular to each other.

17. The micro-electromechanical apparatus of claim 15, further comprising:
    a plurality of unbalance masses, wherein each of the unbalance masses is disposed between the region and the first frame, and each of the unbalance masses has a concave portion facing the axis.

18. The micro-electromechanical apparatus of claim 17, further comprising:
    a plurality of first springs, wherein at least one of the unbalance masses is a first mass, and each of the first springs is connected to the first frame and a corresponding one of the first masses along a direction parallel to a Y-axis.

19. The micro-electromechanical apparatus of claim 18, further comprising:
    a plurality of second springs, wherein at least one of the unbalance masses is a second mass, and each of the second springs is connected to the first frame and a corresponding one of the second masses along a direction parallel to an X-axis.

20. The micro-electromechanical apparatus of claim 19, wherein the first spring or the second spring is a torsion beam.

21. The micro-electromechanical apparatus of claim 17, further comprising:
  a plurality of third masses, wherein each of the third masses is disposed between the region and the first frame, and a portion of the third mass is surrounded by the concave portion of a corresponding one of the unbalance masses.

22. The micro-electromechanical apparatus of claim 21, further comprising:
  at least one third frame; and
  a plurality of third springs respectively connected to the third masses and the third frame;
  wherein the at least one first support and the at least one second support is connected to the at least one third frame, and the third masses are disposed within the third frame.

23. The micro-electromechanical apparatus of claim 21, wherein each of the third masses is a frame.

24. The micro-electromechanical apparatus of claim 1, further comprising:
  at least one first support; and
  at least one second support, wherein the at least one first support and the at least one second support are connected to a corresponding one of the pivot elements symmetrically.

25. The micro-electromechanical apparatus of claim 24, wherein a distance between the pivot end and an adjacent pivot end is the same as that between the pivot end and another adjacent pivot end.

26. The micro-electromechanical apparatus of claim 24, wherein each of the plurality of pivot elements has the same length.

27. The micro-electromechanical apparatus of claim 24, further comprising:
  at least one spring, wherein each of the pivot ends is connected to a corresponding one of the first anchors via the at least one spring.

28. The micro-electromechanical apparatus of claim 24, wherein the at least one first support and the at least one second support are perpendicular to each other.

29. The micro-electromechanical apparatus of claim 24, further comprising:
  a plurality of unbalance masses disposed between the region and the first frame, wherein each of the unbalance masses has a concave portion facing the axis.

30. The micro-electromechanical apparatus of claim 29, further comprising:
  a plurality of first springs, wherein at least one of the unbalance masses is a first mass, and each of the first springs is connected to the first frame and a corresponding one of the first masses along a direction parallel to a Y-axis.

31. The micro-electromechanical apparatus of claim 30, further comprising:
  a plurality of second springs, wherein at least one of the unbalance masses is a second mass, and each of the second springs is connected to the first frame and a corresponding one of the second masses along a direction parallel to an X-axis.

32. The micro-electromechanical apparatus of claim 29, further comprising:
  a third mass disposed between the region and the first frame, wherein a portion of the third mass is surrounded by the concave portion of the unbalance mass.

33. The micro-electromechanical apparatus of claim 1, further comprising:
  a plurality of unbalance masses disposed between the region and the first frame, wherein each of the unbalance mass has a concave portion facing the axis.

34. The micro-electromechanical apparatus of claim 33, wherein a distance between the pivot end and an adjacent pivot end is the same as that between the pivot end and another adjacent pivot end.

35. The micro-electromechanical apparatus of claim 33, wherein each of the plurality of pivot elements has the same length.

36. The micro-electromechanical apparatus of claim 33, further comprising:
  at least one spring, wherein each of the pivot ends is connected to a corresponding one of the first anchors via the at least one spring.

37. The micro-electromechanical apparatus of claim 33, further comprising:
  a plurality of first springs, wherein at least one of the unbalance masses is a first mass, and each of the first springs is connected to the first frame and a corresponding one of the first masses along a direction parallel to a Y-axis.

38. The micro-electromechanical apparatus of claim 37, further comprising:
  a plurality of second springs, wherein at least one of the unbalance masses is a second mass, and each of the second springs is connected to the first frame and a corresponding one of the second masses along a direction parallel to an X-axis.

39. The micro-electromechanical apparatus of claim 33, further comprising:
  a third mass disposed between the region and the first frame, wherein a portion of the third mass is surrounded by the concave portion of the unbalance masses.

40. The micro-electromechanical apparatus of claim 33, wherein a width of the pivot end of each of the pivot elements is less than a width of the rotary end of each of the pivot elements.

* * * * *